(12) United States Patent
Nakamura et al.

(10) Patent No.: US 7,177,612 B2
(45) Date of Patent: Feb. 13, 2007

(54) FREQUENCY GENERATOR AND COMMUNICATION SYSTEM USING THE SAME

(75) Inventors: Takahiro Nakamura, Tokyo (JP); Kenichi Ohhata, Kagoshima (JP); Toru Masuda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 356 days.

(21) Appl. No.: 10/901,966

(22) Filed: Jul. 30, 2004

(65) Prior Publication Data

US 2005/0059373 A1 Mar. 17, 2005

(30) Foreign Application Priority Data

Aug. 28, 2003 (JP) .............................. 2003-305009
Jun. 25, 2004 (JP) .............................. 2004-187412

(51) Int. Cl.
  *H04B 7/00* (2006.01)
  *H04B 1/18* (2006.01)
  *H04B 1/16* (2006.01)

(52) U.S. Cl. ................... 455/265; 455/150.1; 455/280; 455/341; 331/143; 331/176; 333/167; 327/552

(58) Field of Classification Search ............... 455/130, 455/138, 141, 150.1, 161.2, 192.1, 205, 208, 455/209, 230, 255, 265, 280, 289, 323, 334
See application file for complete search history.

(56) References Cited

U.S. PATENT DOCUMENTS

| 4,775,830 A | * | 10/1988 | Lyyra | 324/601 |
| 5,008,659 A | * | 4/1991 | Hovens | 345/211 |
| 5,121,118 A | * | 6/1992 | Hermann | 341/118 |
| 5,870,004 A | * | 2/1999 | Lu | 331/176 |
| 6,285,865 B1 | * | 9/2001 | Vorenkamp et al. | 455/307 |
| 6,724,379 B2 | * | 4/2004 | Markis | 345/209 |
| 2001/0007151 A1 | * | 7/2001 | Vorenkamp et al. | 725/151 |

FOREIGN PATENT DOCUMENTS

| JP | 09-311894 | 5/1999 |
| JP | 2001-158545 | 6/2001 |

OTHER PUBLICATIONS

Dimitrijev, "Understanding Semiconductor Devices," Oxford University Press, NY, 2000, pp. 168-170.
Allen and Holdber, "CMOS Analog Circuit Design," Oxford University Press, NY, 1987, pp. 124-127.

* cited by examiner

*Primary Examiner*—Tony T. Nguyen
(74) *Attorney, Agent, or Firm*—Antonelli, Terry, Stout and Kraus, LLP.

(57) ABSTRACT

A frequency generator which can perform stable frequency oscillation unaffected by temperature variation.

A frequency generator having a differential amplifier (1) having an LC resonance circuit (10) as a load and buffer circuits (21, 22) feeding back an output of the differential amplifier to its input, wherein a temperature coefficient converter (5) converting an output voltage of a reference voltage generator (4) and its temperature dependence to a voltage having a predetermined voltage and temperature coefficient and outputting it is provided to control bias currents IEF of emitter follower circuits to be in proportion to temperature variation. There are a characteristic in which delay time of the emitter follower circuits constructing the buffer circuits is in inverse proportion to a transconductance of transistors and a characteristic in which the transconductance is in inverse proportion to temperature and is in proportion to the bias currents IEF. An oscillation frequency stable to temperature variation can be obtained.

14 Claims, 23 Drawing Sheets

FREQUENCY GENERATOR AND COMMUNICATION SYSTEM USING THE SAME

CLAIM OF PRIORITY

The present application claims priority from Japanese patent application Ser. no. JP 2004-187412 filed on Jun. 25, 2004, which further claims priority from Japanese patent application Ser. no. JP 2003-305009 filed on Aug. 28, 2003, the contents of which are hereby incorporated by reference into this application.

BACKGROUND OF THE INVENTION

1. Field of the Invention

The present invention relates to a frequency generator and a communication system using the same. More specifically, the present invention relates to temperature compensation of an oscillation frequency of a frequency generator.

2. Description of the Related Art

FIG. 1 is a circuit diagram showing an example of a differential LC resonance type of voltage controlled frequency generator using a prior art LC resonator. The differential LC resonance type of voltage controlled frequency generator has a differential amplifier 30 having an LC resonator 10 as a load and feedback buffer circuits 21, 22 having transistors Q3, Q5 feeding back an output signal of the differential amplifier to its input. The buffer circuit receives as an input an output of the collector of one of transistors Q11, Q12 forming a differential transistor pair of the amplifier and inputs an output to the base of the other transistor. Typically, such kind of feedback buffer circuit desirably feeds back a signal without attenuating it. A circuit construction such as a capacitor, emitter follower circuit or source follower circuit is generally employed.

An oscillation frequency of the differential LC resonance type of voltage controlled frequency generator is expressed by the following equation (1) using inductance L of inductors L1, L2 constructing the LC resonator 10, capacitance $C_V$ of diodes C1, C2, and wiring parasitic capacitance $C_P$:

$$f_{OSC} = \frac{1}{2\pi\sqrt{L(C_V + C_P)}} \quad (1)$$

Frequency control is performed by controlling the capacitance CV of the diodes C1, C2 as variable capacitors with a voltage applied to frequency control terminal VCONT. When the buffer circuits 21, 22 are constructed by capacitive coupling, to form capacitance used in capacitance feedback in an integrated circuit, capacitance between metal wire layers, capacitance between polycrystalline silicon layers, or capacitance between a polycrystalline silicon and a metal wire layer is generally used.

As shown in FIG. 1, when using the emitter follower circuit as the feedback buffer circuit, wiring parasitic capacitance parasitized in signal feedback capacitance in capacitance feedback can be reduced. When an oscillation frequency is high, a wide frequency tuning range can be obtained. As an oscillation frequency is increased, it is effective to use the emitter follower circuit as a feedback circuit. Since the emitter follower circuit has a low output impedance, the transistors Q11, Q12 constructing the differential amplifier 30 can be easily driven and the oscillator can be oscillated at high frequencies.

The construction as shown in FIG. 1 is disclosed in Japanese Patent Application Laid-Open No. 2001-156545.

[Patent Document 1]

Japanese Patent Application Laid-Open No. 2001-156545 (FIG. 3)

[Non-Patent Document 1]

Written by Sima Dimitrijev, "Understanding Semiconductor Devices", Oxford University Press, 2000, pp. 168–170

[Non-Patent Document 2]

Written by Allen and Holberg, "CMOS Analog Circuit Design", Oxford University Press, 1987, pp. 124–127

SUMMARY OF THE INVENTION

In the capacitance feedback in which the feedback buffer circuits are constructed by capacitive coupling, a metal wire or a polycrystalline silicon layer used as a capacitor forms parasitic capacitance between it and a substrate to increase wiring parasitic capacitance. The voltage controlled frequency generator generating a frequency above a few gigahertz which must reduce the product of the LC increases wiring parasitic capacitance. The variable capacitors C1, C2 of the buffer circuits must be reduced, which narrows the frequency tuning range.

When using the emitter follower circuit as the feedback buffer circuit, the frequency tuning range can be larger than that of capacitance feedback. Oscillation frequency fluctuation due to temperature variation is a problem. To the feedback circuit of such circuit, added is a voltage stabilizing circuit having diode-connected transistors Q55, Q66 as shown in FIG. 19, direct-current canceling temperature dependence. Alternating-current delay cannot be corrected. In the emitter follower circuit feedback, the emitter follower circuit is included in an oscillation loop. Delay time tpd of a voltage signal from input to output of the emitter follower circuit must be considered. Oscillation frequency $f_{OSC}$ is decided by the following equation (2)

$$f_{OSC} = \frac{1}{2\pi\sqrt{L(C_V + C_P)} + tpd} \quad (2)$$

The delay time tpd is decided by the product of an output resistance of the emitter follower circuit by load capacitance. The output resistance of the emitter follower circuit is expressed by 1/gm. Here, the gm is a transconductance of the transistors Q3, Q5 of the emitter follower circuits constructing the buffer circuits 21, 22 shown in FIG. 1 and is expressed by the following equation (3)

$$gm = \frac{qI_{EF}}{k_B T} \quad (3)$$

where q, $I_{EF}$, $k_B$ and T are an electric charge of an electron, a collector current (that is, bias current) of the emitter follower circuit, Boltzmann constant, and temperature. The tpd is expressed by the following equation (4) when load capacitance is $C_L$:

$$tpd = \frac{C_L}{gm} = \frac{k_B T C_L}{q I_{EF}} \quad (4)$$

From the equation (4), the delay time tpd is in proportion to the temperature T. With temperature variation, the oscillation frequency $f_{OSC}$ is changed according to the equation (2).

As described above, when using the emitter follower circuits as the buffer circuits 21, 22, the frequency tuning range can be enlarged and an oscillation frequency is changed due to temperature variation.

Accordingly, an object of the present invention is to provide a frequency generator and a communication system using the same which can generate a highly stable oscillation frequency unaffected by temperature variation when an emitter follower circuit as a feedback buffer circuit.

Some representative means of a frequency generator according to the present invention are as follows.

(1) A frequency generator according to the present invention has an amplifier amplifying an input signal; a fixed temperature-dependence circuit outputting a signal having predetermined temperature dependence to temperature variation; a buffer circuit feeding back an output signal of the amplifier to the input of the amplifier; and a delay-time control circuit receiving as an input an output signal of the fixed temperature-dependence circuit and outputting a control signal controlling delay time of a signal from input to output of the buffer circuit, wherein the buffer circuit has a delay-time control terminal, and the control signal inputted to the delay-time control terminal controls delay time of the buffer circuit to allow an oscillation frequency to have predetermined temperature dependence.

(2) Preferably, the frequency generator according to the (1), wherein the fixed temperature-dependence circuit is a reference voltage generator outputting a voltage having constant temperature dependence to temperature, and wherein the delay-time control circuit is a temperature coefficient converter converting the temperature dependence of an output voltage of the reference voltage generator to predetermined temperature dependence and outputting it as the control signal.

(3) The frequency generator according to the (2), wherein the buffer circuit may include an emitter follower circuit using a first bipolar transistor and a current source supplying a bias current to the emitter follower circuit, and wherein the delay-time control terminal may be a current control terminal of the bias current source of the emitter follower circuit. In such construction, the bias current of the emitter follower circuit is controlled to control delay time.

The emitter follower circuit and the bias current source may be a source follower circuit using a MOS transistor in place of the bipolar transistor.

(4) The frequency generator according to the (3), wherein the bias current source of the emitter follower circuit may have a second bipolar transistor and a resistance connected to the emitter of the second bipolar transistor, and wherein the base of the second bipolar transistor may be the current control terminal. The bias current source constructed of a source follower circuit may have a second MOS transistor and a resistance connected to the source of the second MOS transistor, and the gate of the second MOS transistor may be the current control terminal.

(5) Preferably, the frequency generator according to any one of the (1) to (4), wherein the reference voltage generator and the temperature coefficient converter may be constructed of a bandgap reference circuit.

(6) Preferably, the frequency generator according to the (2), wherein the amplifier is a differential amplifier having first and second transistors of a differential transistor pair in which each collector is connected via an LC resonance load to a first constant-voltage terminal, and emitters are shareably connected and are connected via a first constant-current source to a second constant-voltage terminal, wherein the LC resonance load is constructed such that one end of first and second variable capacitors whose capacitances are equal is connected to a frequency control terminal, and the other end thereof is connected to each of the collectors of the first and second transistors of the differential transistor pair and is connected via first and second inductors whose inductances are equal to the first constant-voltage terminal, wherein the buffer circuit is constructed of:

a first buffer circuit including a third transistor in which the collector of the first transistor of the differential transistor pair is connected to the base and the collector is connected to the first constant-voltage terminal and a forth transistor in which the collector is connected to the emitter of the third transistor, the base is connected to the output of the temperature coefficient converter and the emitter is connected via a first resistance to the second constant-voltage terminal; and a second buffer circuit including a fifth transistor in which the collector of the second transistor of the differential transistor pair is connected to the base and the collector is connected to the first constant-voltage terminal and a sixth transistor in which the collector is connected to the emitter of the fifth transistor, the base is connected to the output of the temperature coefficient converter and the emitter is connected via a second resistance to the second constant-voltage terminal, wherein a first output terminal of the frequency generator is connected to the collector of the sixth transistor of the first buffer circuit, and a second output terminal of the frequency generator is connected to the collector of the fourth transistor. The amplifier and the first and the second buffer circuits may be constructed of MOS transistors in place of the bipolar transistors.

DETAILED DESCRIPTION OF THE PREFERRED EMBODIMENTS

Figure 1:
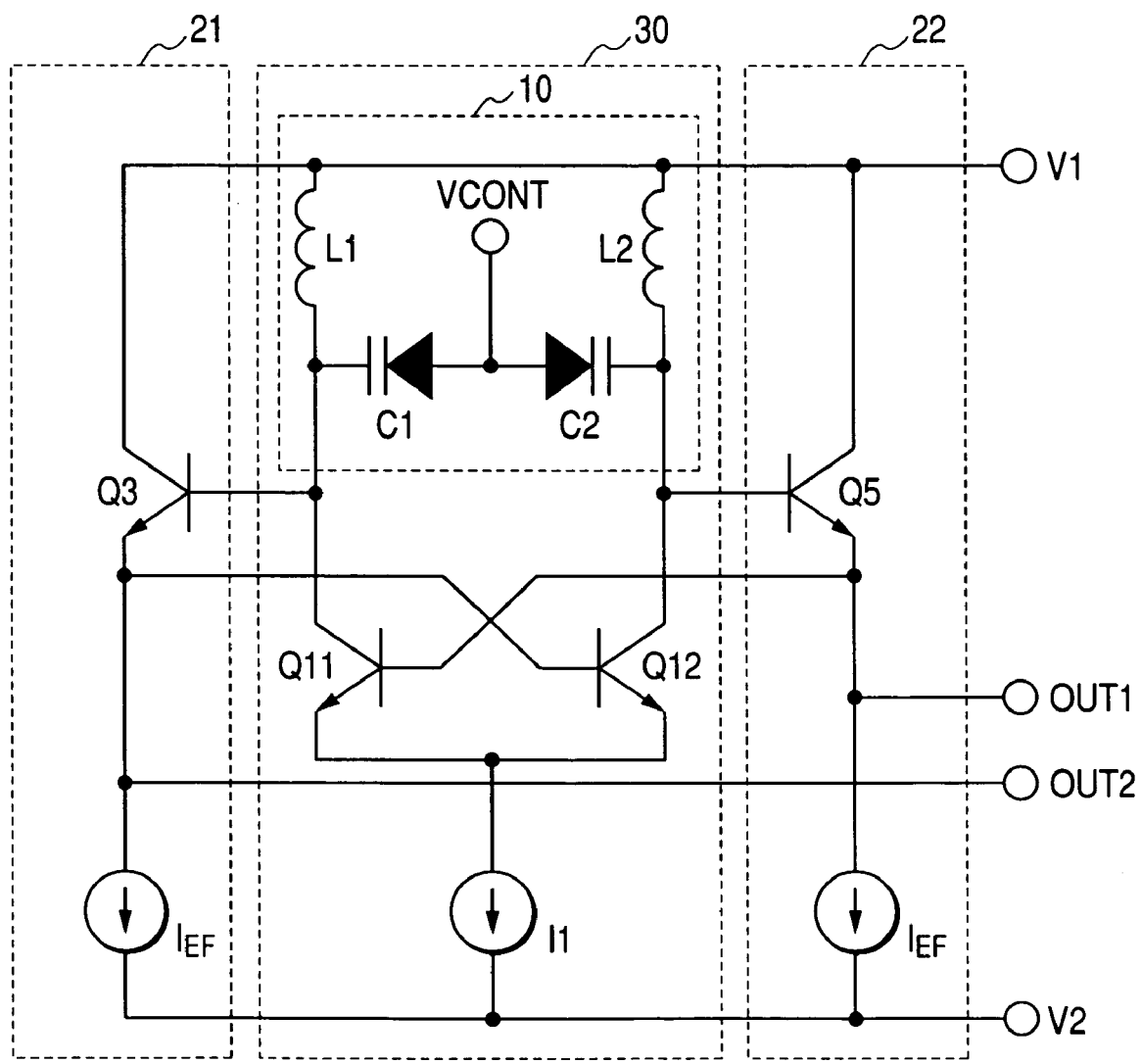
FIG. 1 is a circuit diagram showing a prior art frequency generator.

An embodiment of a frequency generator according to the present invention will be described using FIG. 2. As shown in the block diagram of FIG. 2, the frequency generator of the present invention has an amplifier (AMP) 1, a buffer circuit (BFC) 2 feeding back an output of the amplifier 1 to its input, a fixed temperature-dependence circuit (TSC) 6, and a delay-time control circuit (DCONT) 7 and outputs an oscillation frequency stable to temperature from output terminal OUT of the buffer circuit 2.

The buffer circuit 2 is provided with a delay-time control terminal 103 for controlling delay time of a voltage signal from input to output of the buffer circuit.

The fixed temperature-dependence circuit 6 outputs a signal having a voltage, electric current, frequency or pulse width having predetermined dependence to temperature. For example, as the voltage signal having predetermined dependence to temperature, an output voltage of a bandgap reference circuit can be used. As the signal having the frequency, a frequency outputted by a crystal oscillator can be used. As the signal having the pulse width, a pulse width of a signal obtained by multiplying or dividing an output signal of the crystal oscillator can be used.

The delay-time control circuit 7 is a circuit referring to the characteristic output stable to temperature of the fixed temperature-dependence circuit 6 to output a signal having a voltage, electric current, frequency or pulse width controlling delay time of the buffer circuit 2 according to temperature to the delay-time control terminal 103.

The construction can realize a frequency generator which can make delay time of the buffer circuit constant without depending on temperature and output an oscillation frequency to highly stable to temperature. Alternatively, it can provide a frequency generator outputting an oscillation frequency having predetermined temperature dependence when allowing delay time to have predetermined temperature dependence.

[Embodiment 1]

Figure 2:
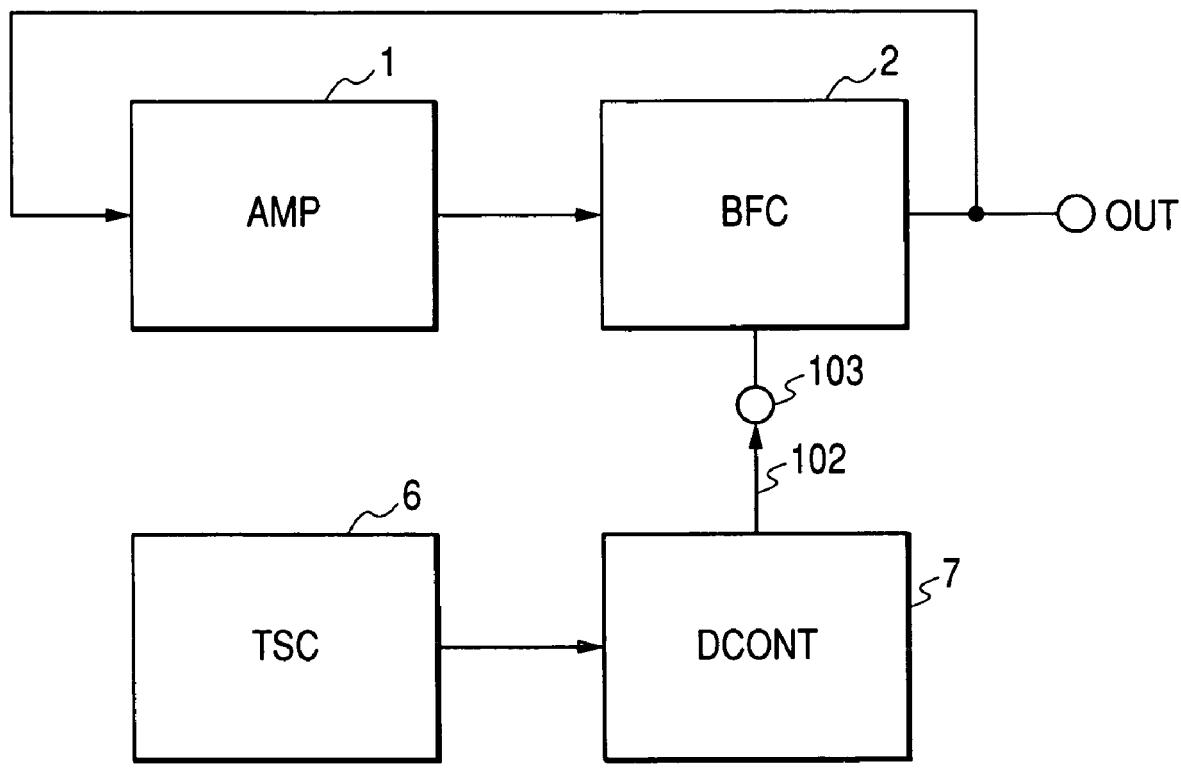
FIG. 2 is a block diagram showing the construction of a frequency generator according to the present invention.
Figure 3:
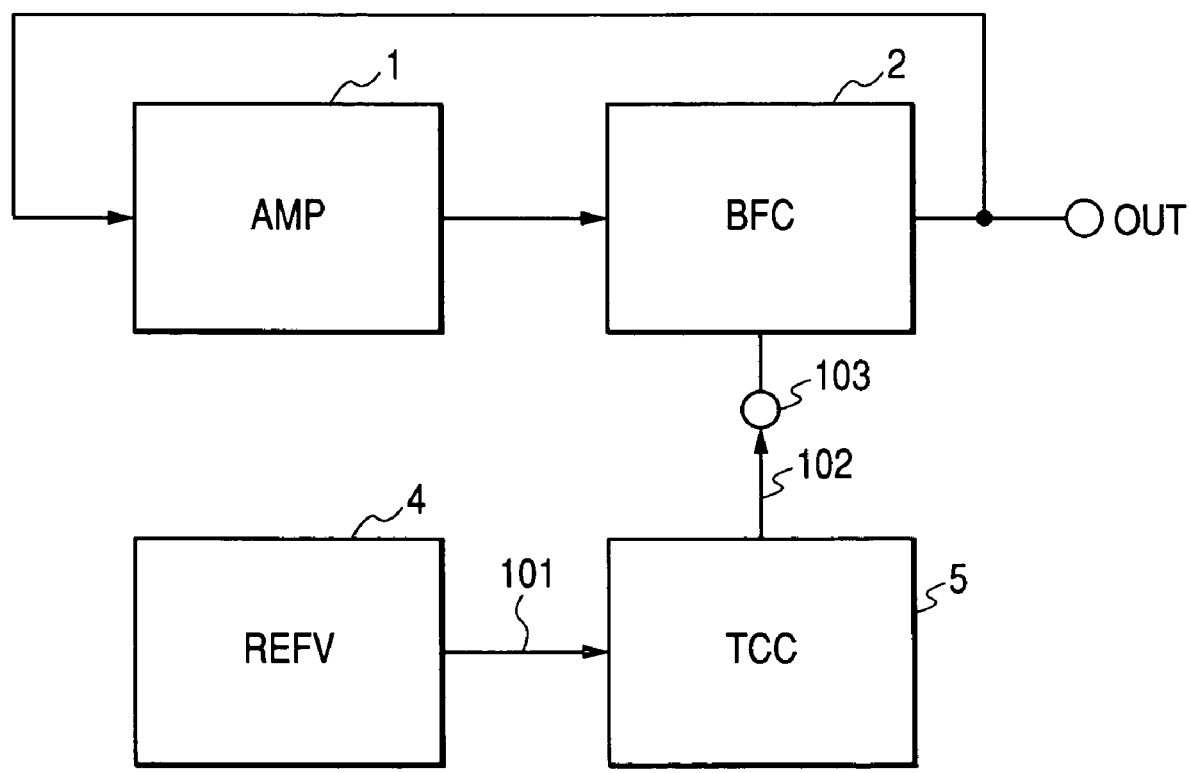
FIG. 3 is a block diagram showing a first embodiment of a frequency generator according to the present invention.

FIG. 3 is a block diagram showing a first embodiment of a frequency generator according to the present invention. The frequency generator of this embodiment has an amplifier 1, a buffer circuit (BFC) 2 feeding back an output of the amplifier 1 to its input, a reference voltage generator (REFV) 4, and a temperature coefficient converter (TCC) 5. In this embodiment, the temperature stabilizing circuit 6 of FIG. 2 is replaced with the reference voltage generator 4 outputting a voltage stable to temperature and having predetermined dependence, and the delay-time control circuit (DCONT) 7 is replaced with the temperature coefficient converter 5 converting the temperature dependence of an output voltage of the reference voltage generator 4 to predetermined temperature dependence. The same reference numerals in the following description indicate identical or similar construction parts.

Figure 4:
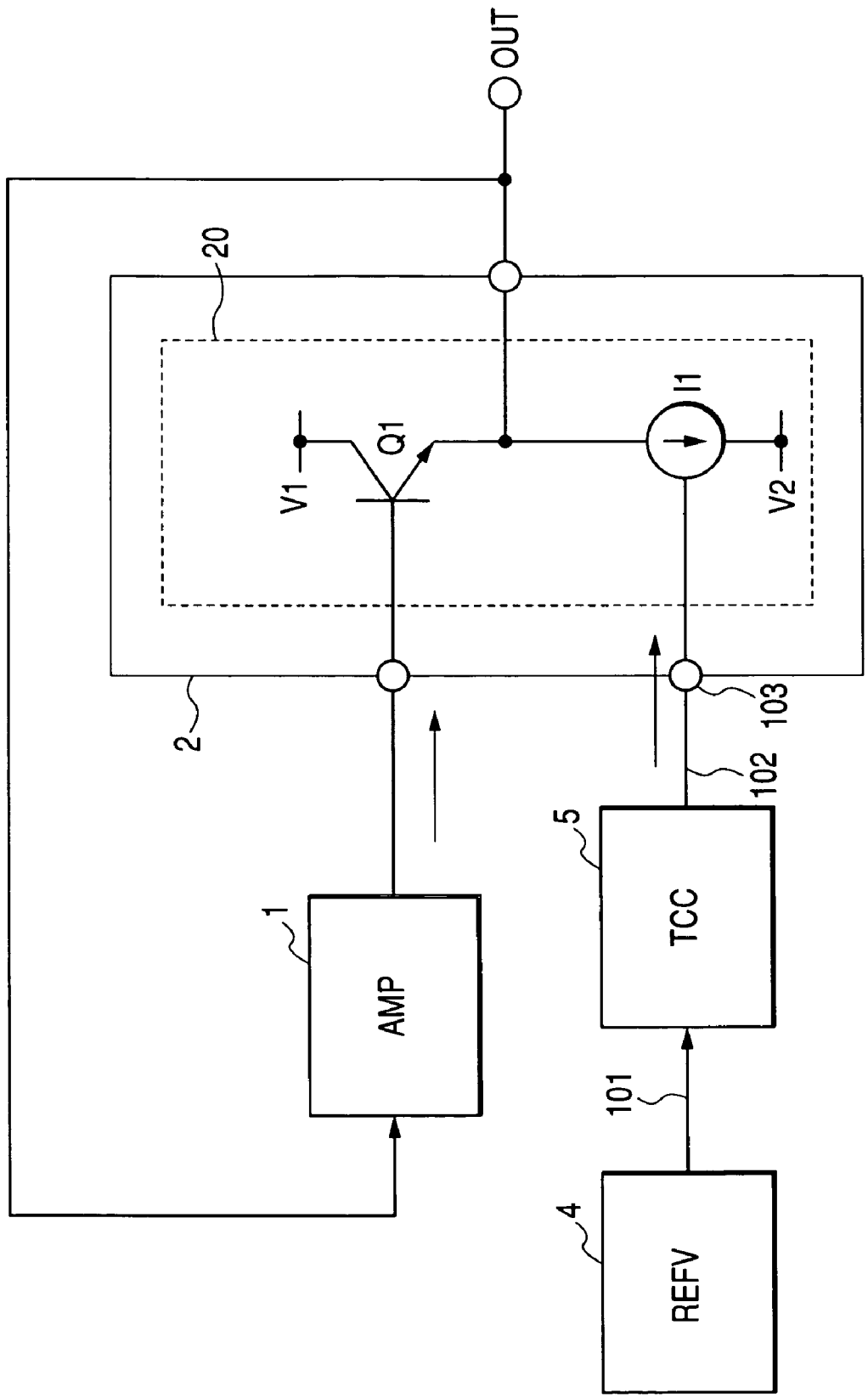
FIG. 4 is a block diagram of the frequency generator showing a construction example of a buffer circuit of FIG. 3.

FIG. 4 shows a block diagram of the frequency generator showing a construction example of the feedback buffer circuit 2 of FIG. 3. The buffer circuit 2 is constructed of an emitter follower circuit 20 having transistor Q1 and current source I1. The buffer circuit 2 also has a delay-time control terminal 103 for controlling the current source I1 supplying a bias current to control delay time of the emitter follower circuit 20.

The temperature coefficient converter 5 converts an output of the reference voltage generator 4 to a voltage necessary for allowing delay time of the emitter follower circuit to have constant or predetermined temperature dependence to input it to the delay-time control terminal 103. V1 is a high-potential side source voltage and V2 is a low-potential side source voltage.

The construction can obtain a frequency generator outputting from output terminal OUT an oscillation frequency highly stable to temperature or an oscillation frequency having predetermined temperature dependence.

Figure 5:
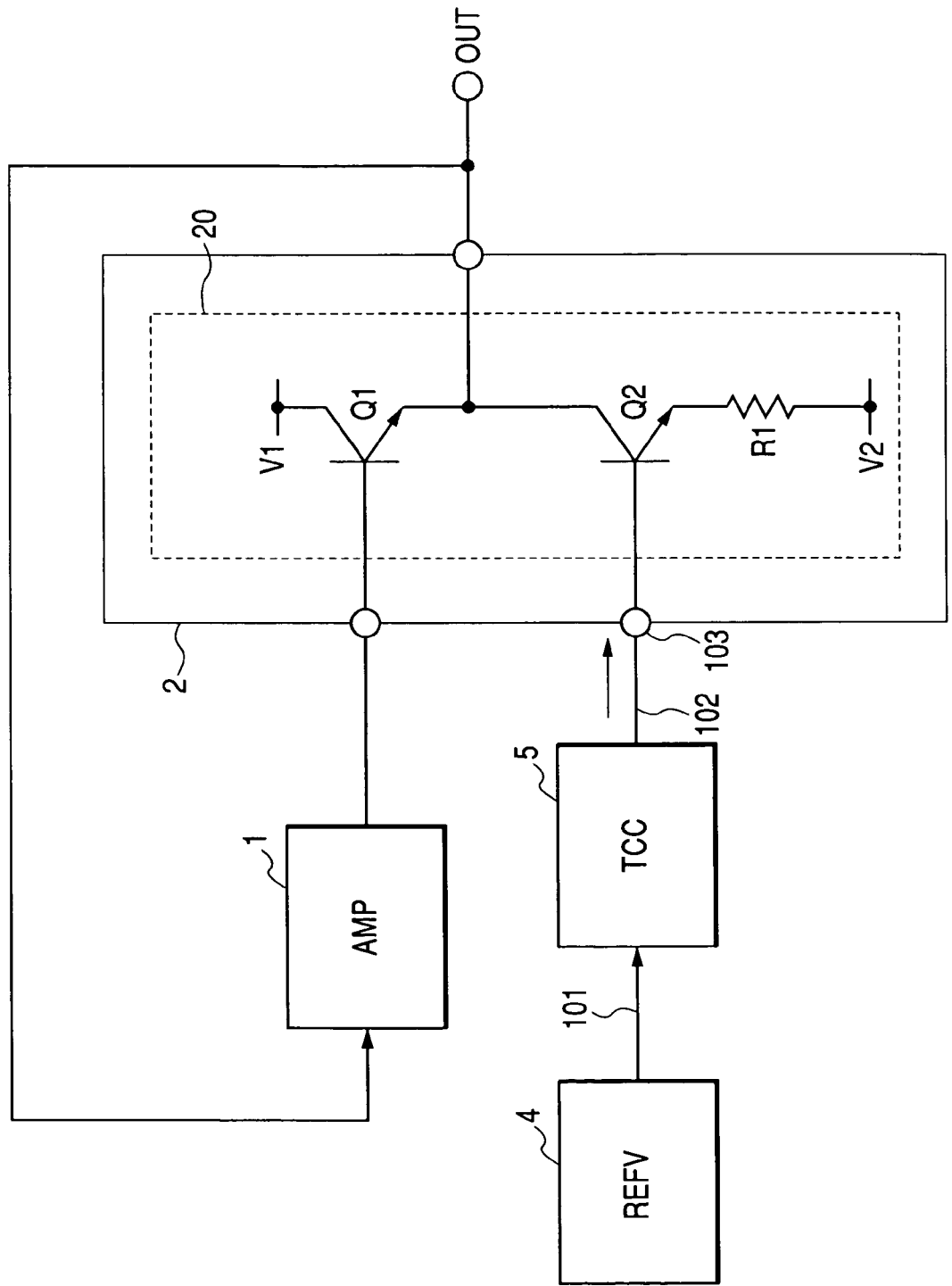
FIG. 5 is a block diagram of the frequency generator showing a construction example of the current source of the buffer circuit of FIG. 4.

The current source I1 having the delay-time control terminal 103 of FIG. 4, as shown in FIG. 5, can be constructed of bipolar transistor Q2 and resistance R1. In this case, the base terminal of the transistor Q2 is the delay-time control terminal 103 and the base potential of the transistor Q2 controls the bias current I1 to control delay time of the emitter follower circuit 20.

In this embodiment, as compared with the constructions of FIGS. 2 and 3, the buffer circuit 2 is constructed of the emitter follower circuit to control its bias current so that control is easy, and the reference voltage generator is used so that design is easy. As shown in FIG. 5, when the current source circuit has the bipolar transistor and the resistance, as compared with the construction of FIG. 4, an impedance seen from the collector of the transistor Q2 of the current source circuit I1 is high and is excellent as a current source. Control of a bias current is easier.

[Embodiment 2]

Figure 6:
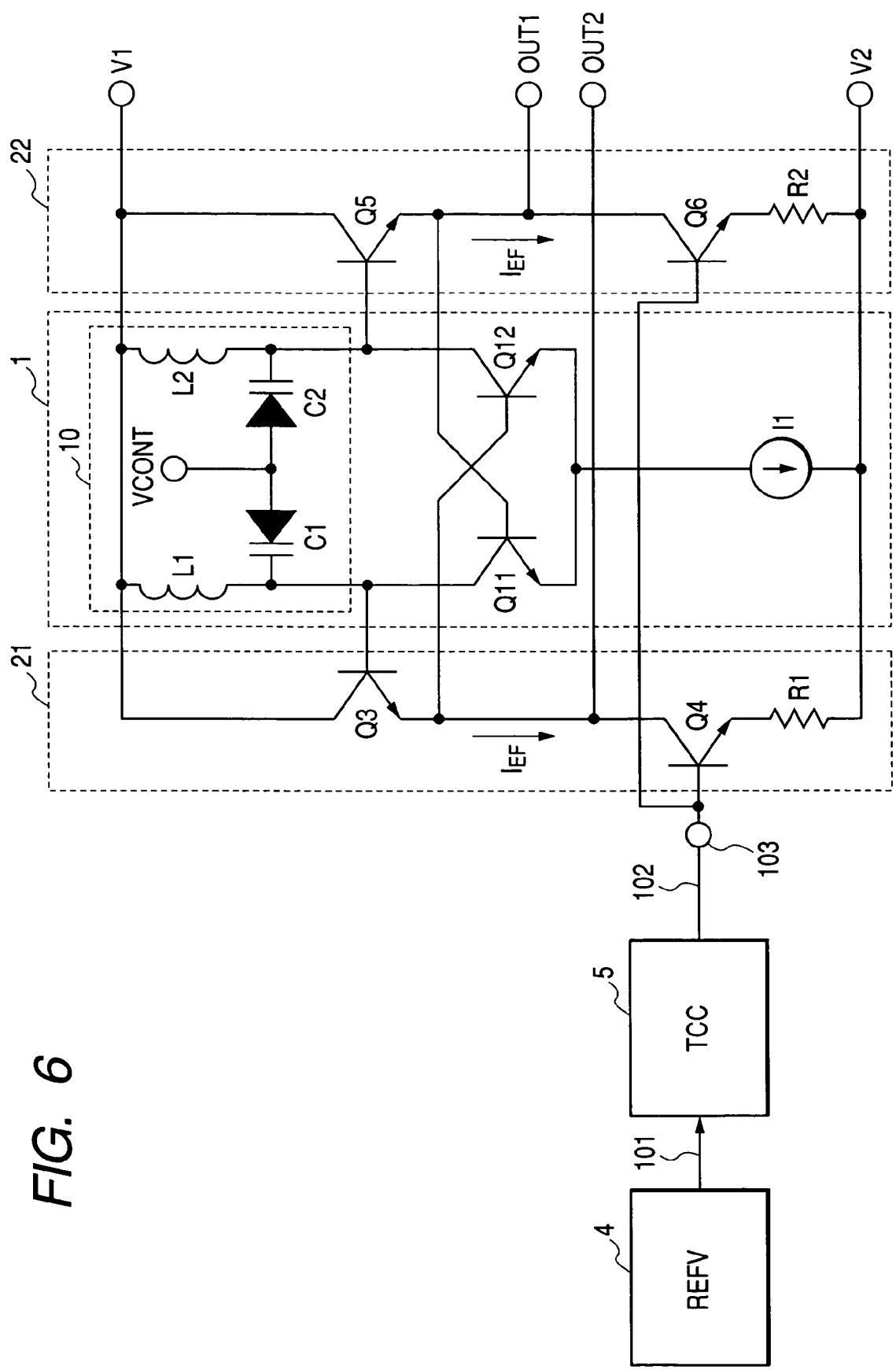
FIG. 6 is a circuit block diagram showing a second embodiment of a frequency generator according to the present invention.

FIG. 6 is a circuit block diagram showing a second embodiment of a frequency generator according to the present invention. The frequency generator of this embodiment has a differential amplifier 1 having an LC resonance circuit 10 as a load, buffer circuits 21, 22 constructed by an emitter follower circuit feeding back each output of the differential amplifier 1 to each input, a reference voltage generator 4, and a temperature coefficient converter 5.

The resonance circuit 10 is a circuit in which inductors L1, L2 and variable capacitors C1, C2 such as variable capacitor diodes are connected in parallel. The differential amplifier 1 has a differential transistor pair Q11, Q12 of bipolar transistors and constant-current source I1.

A frequency control voltage is applied to frequency control terminal VCONT of the variable capacitors C1, C2 to control an oscillation frequency. The differential amplifier 1 amplifies signals inputted from the bases of the differential transistor pair Q11, Q12 of the bipolar transistors by an LC load having a resonance frequency and outputs them from the collectors of the differential transistor pair Q11, Q12. The feedback buffer circuits 21, 22 are constructed of emitter follower circuits, receive, as inputs, outputs of the collectors of the transistors Q11, Q12 of the differential amplifier 1, and input them to the bases of bipolar transistors Q3, Q5. An output of the emitter of the transistor Q3 is outputted to output terminal OUT2, and an output of the emitter of the transistor Q5 is outputted to output terminal OUT1, and they are inputted to the bases of the transistors Q12, Q11 constructing the differential amplifier 1. Bias currents $I_{EF}$ of the emitter follower circuits 21, 22 are decided by the base potentials of transistors Q4, Q6 and resistances R1, R2. An output of the reference voltage generator 4 is inputted to the temperature coefficient converter 5. An output of the temperature coefficient converter 5 is inputted to the bases of the transistors Q4, Q6. The bias currents $I_{EF}$ Of the buffer circuits 21, 22 constructed of emitter follower circuits are controlled.

The operation of the thus-constructed circuit of FIG. 6 will be described.

Figure 7:
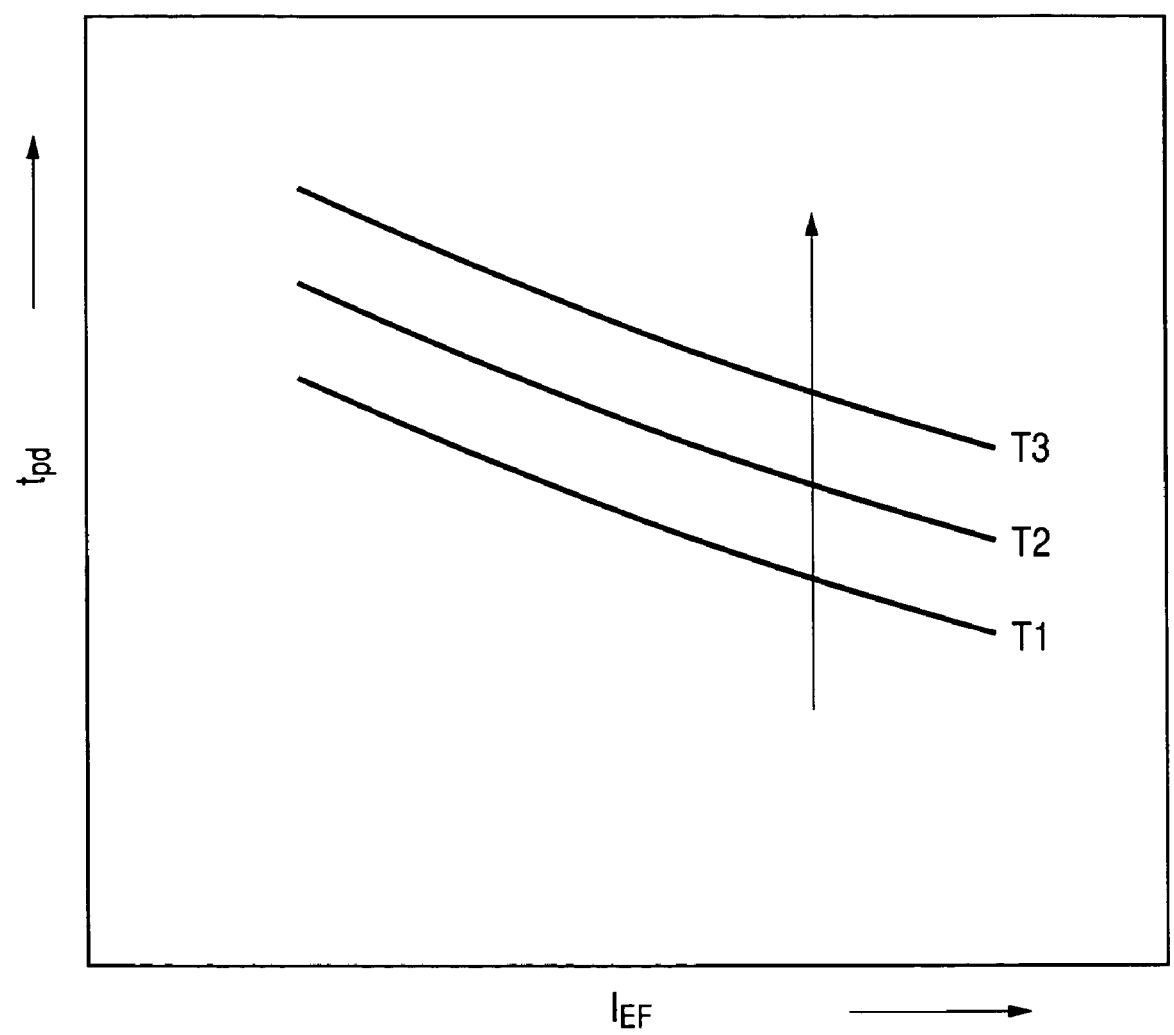
FIG. 7 is a diagram showing bias current dependence of delay time of an emitter follower circuit with temperatures as parameters.

Oscillation frequency $f_{OSC}$ is given by the equation (2). FIG. 7 schematically shows an example of bias current characteristic of delay time tpd at temperatures T1, T2 and T3 with temperatures as parameters in which the vertical axis indicates the delay time tpd of an emitter follower circuit and the horizontal axis indicates bias current $I_{EF}$. Here, the temperatures T1 to T3 are T1<T2<T3. When the bias current $I_{EF}$ of the emitter follower circuit is constant to temperature, the delay time tpd of the emitter follower circuit is changed with temperature variation according to the equation (4). The oscillation frequency $f_{OSC}$ is changed with temperature variation. The bias current $I_{EF}$ is controlled according to temperature and is controlled in proportion to temperature. The delay time tpd is constant to temperature to obtain a highly stable oscillation frequency. The bias current $I_{EF}$ is expressed by the following equation (5), giving an effect for reducing temperature variation of the oscillation frequency $f_{OSC}$:

$$I_{EF}(T) = I_{EF}(T_0) \cdot \left[\frac{T}{T_0}\right] \quad (5)$$

To realize the relation of the equation (5), bias voltage $V_{EF}$ for flowing the bias current $I_{EF}$ of the emitter follower circuit must satisfy the following equation (6)

$$V_{EF}(T) = V_{BE}(T) + R_{EF}(T) \cdot I_{EF}(T_0) \cdot \left[\frac{T}{T_0}\right] \quad (6)$$

where voltage $V_{BE}$ (T) is a base-emitter voltage at temperature T of the transistors Q4, Q6 flowing a bias current of the emitter follower circuit, $R_{EF}$ (T) is a resistance value of resistances R1, R2 at the temperature T, $I_{EF}$ ($T_0$) is the bias current $I_{EF}$ at temperature $T_0$, and $T_0$ is an operation center temperature.

When the bias voltage $V_{EF}$ having temperature dependence satisfying the relation as shown in the equation (6) can be inputted as an output 102 of the temperature coefficient converter 5 to the base terminals of the transistors Q4, Q6 of the current source of the emitter follower circuit, that is, to the delay-time control terminal 103, the bias current $I_{EF}$ having the temperature dependence shown in the equation (5) can be realized. Consequently, the delay time tpd shown in the equation (4) can be constant to temperature variation and the oscillation frequency $f_{OSC}$ can be stabilized to temperature variation.

The delay time tpd of the emitter follower circuit is in inverse proportion to a transconductance of the transistor constructing the emitter follower circuit, and the transconductance is in inverse proportion to temperature and is proportion to the bias current. An output of the temperature coefficient converter is inputted to the delay-time control terminal 103 to control the bias current of the buffer circuit to be changed in proportion to temperature, obtaining an oscillation frequency stable to temperature variation.

In the construction of FIG. 6, as compared with the constructions of FIGS. 2 to 5, the amplifier is the differential amplifier having the LC resonance circuit as a load. It has good phase noise and has high stability to source voltage.

The construction of the temperature coefficient converter 5 obtaining the bias voltage $V_{EF}$ (T) having the temperature dependence shown in the equation (6) will be described.

A known bandgap reference circuit can output the bias voltage VEF. When the second term of the equation (6) must be set to be large, two bipolar transistors whose current densities are largely different are necessary. The number of parallel bipolar transistors must be increased. The circuit occupation area is increased.

Figure 8:
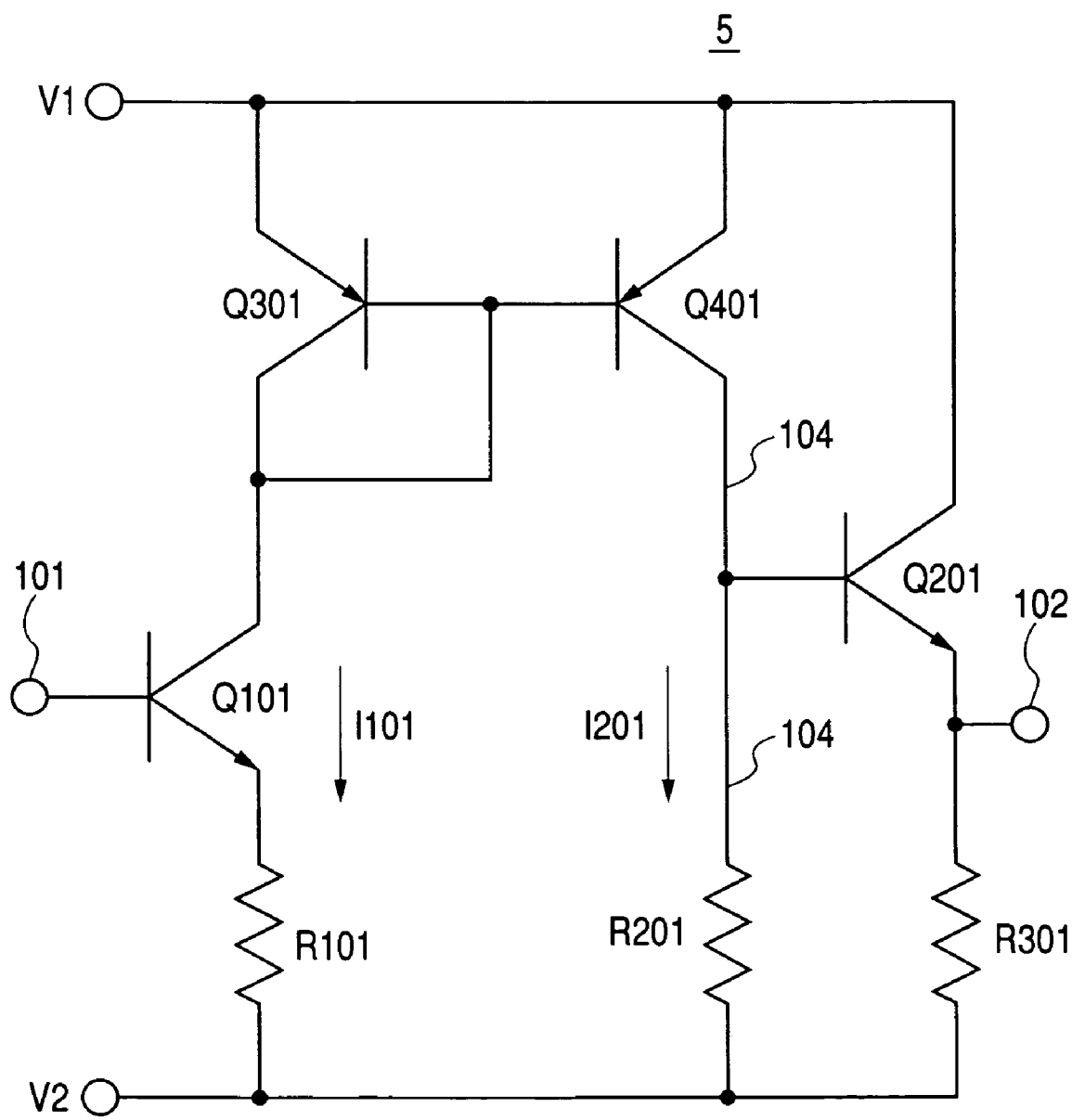
FIG. 8 is a circuit diagram showing a construction example of a temperature coefficient converter of FIG. 6.

FIG. 8 is a construction example of the temperature coefficient converter 5. A voltage of an output 101 of the reference voltage generator (REFV) 4 and its temperature dependence are converted to the bias voltage $V_{EF}$ having a predetermined voltage and temperature coefficient. It has NPN bipolar transistors Q101, Q201, PNP bipolar transistors Q301, Q401, and resistances R101, R201 and R301. Collector current I101 of the NPN transistor Q101 is decided by an emitter voltage of the Q101 and the resistance R101. In order that the temperature dependence of the collector current I101 is 0 A/° C., the temperature dependence of an emitter voltage of the NPN transistor Q101 must be 0V/° C.

The emitter voltage of the NPN transistor Q101 is a voltage obtained by subtracting the base-emitter voltage $V_{BE}$ of the transistor Q101 from the base voltage of the transistor Q101. The base-emitter voltage $V_{BE}$ has temperature dependence of −2 mV/° C. The base voltage of the NPN transistor Q101 must have temperature dependence of −2 mV/° C. At this time, the base of the transistor Q101 is connected to the output of the reference voltage generator 4 having temperature dependence of −2 mV/° C.

The temperature dependence of the collector current I101 is 0 A/° C., with a current mirror constructed by the PNP transistors Q301 and Q401, the temperature dependence of current I201 flowing in the PNP transistor Q401 is also 0 A/° C. The potential is increased by the resistance R201 to be inputted to the base of the NPN transistor Q201. The emitter is connected to the output terminal 102. In the voltage of the output terminal 102, the base-emitter voltage $V_{BE}$ Of the NPN transistor Q201 having temperature dependence of −2 mV/° C. is subtracted from a voltage of the temperature dependence of 0V/° C.

A potential having temperature dependence of +2 mV/° C. is obtained. When a potential of one end 104 of the resistance R201 is selected, a potential having temperature dependence of 0V/° C. is obtained. The temperature dependence can be finely adjusted by suitably controlling the current densities of the NPN transistors Q101 and Q201.

The construction of FIG. 8 is an amplifier having a gain of (R201×I201)/(R101×I101). Noise of the output 101 of the reference voltage generator 4 is amplified. The circuit construction is simple, easily realizing the stable temperature coefficient converter 5. The bipolar transistor has a region having small dependence to collector-emitter voltage VCE in which when a base current value is constant, a collector current value is also constant. The circuit of FIG. 8 is a circuit stable to fluctuation in source voltage V1 or V2 using the region.

[Embodiment 3]

Figure 9:
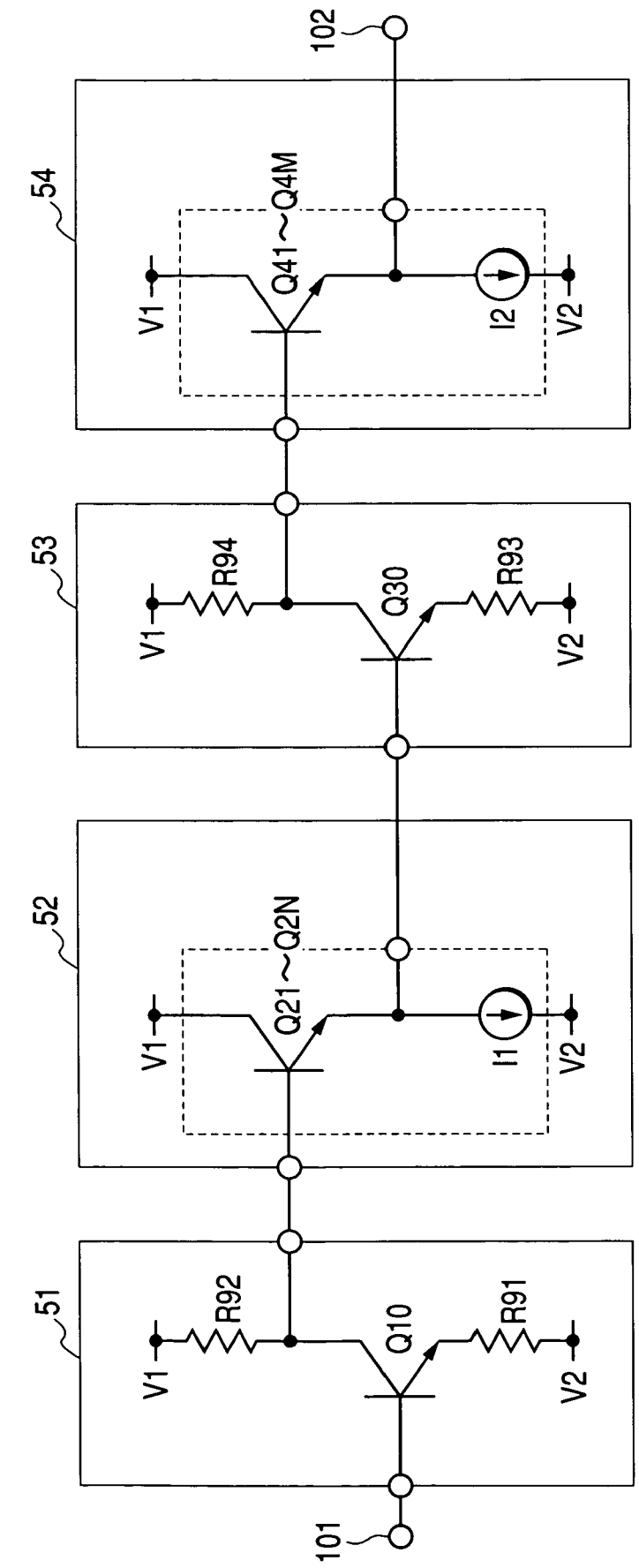
FIG. 9 is a block diagram showing a third embodiment of a frequency generator according to the present invention.

FIG. 9 is a diagram showing a third embodiment of a frequency generator according to the present invention and is another construction example of the temperature coefficient converter 5 used in the frequency generator of the differential amplifier construction shown in FIG. 6. It is a circuit which can improve the noise characteristic of the temperature coefficient converter of FIG. 8 and obtain temperature dependence in a wide range.

The temperature coefficient converter of this embodiment has a collector output stage 51 receiving as an input an output 101 of the reference voltage generator, having NPN bipolar transistor Q10 and resistances R91, R92 and fetching an output from the collector of the transistor Q10, an emitter output stage 52 receiving as an input an output of the collector output stage 51, a collector output stage 53 receiving as an input an output of the emitter output stage 52, having NPN bipolar transistor Q30 and resistances R93, R94 and fetching an output from the collector of the transistor Q30, and an emitter output stage 54 receiving as an input an output of the collector output stage 53 and outputting it to an output terminal 102.

The emitter output stage 52 has NPN transistor Q21 and current source I1, with the NPN transistor Q21 having a base as an input and an emitter as an output as one stage, N emitter output circuits in which N NPN transistors Q21 to Q2N having a base as an input and an emitter as an output are connected in series. The emitter output stage 54 has NPN transistor Q41 and current source I2, with the NPN transistor Q41 having a base as an input and an emitter as an output as one stage, M emitter output circuits in which M NPN transistors Q41 to Q4M are connected in series.

The operation of the thus-constructed temperature coefficient converter of FIG. 9 will be described.

In the temperature dependence of the output of the collector output stage 51, the NPN transistor Q10 adds temperature dependence of +2 mV/° C. to the temperature dependence of a voltage of the input terminal 101 for output from the collector and an absolute value is multiplied by the resistance R92/R91 so that the sign is inverted. Similarly, in the temperature dependence of an output of the collector output stage 53, the transistor Q30 adds temperature dependence of +2 mV/° C. to the temperature dependence of the base voltage of the transistor Q30 for output from the collector and an absolute value is multiplied by the R94/R93 so that the sign is inverted.

In the temperature dependence of an output of the emitter output stage 52, the transistors Q21 to Q2N add temperature dependence of +2 mV/° C.×N to the temperature dependence of the base voltage of the NPN transistor Q21. Similarly, in the emitter output stage 54, the Q41 to Q4M add temperature dependence of +2 mV/° C.×M to the temperature dependence of the base voltage of the transistor Q41. In the collector output stage, the sign of the temperature dependence is inverted. When the resistance values are R91=R92 and R93=R94, the temperature dependence of a voltage of the output terminal 102 of the temperature coefficient converter of FIG. 9 is a value obtained by which the transistor Q10 and the transistors Q41 to Q4M add temperature dependence of +2 mV/° C.×(M+1) to the temperature dependence of an input voltage and the transistors Q21 to Q2N and the transistor Q30 subtract temperature dependence of +2 mV/° C.×(N+1) from it.

When the number of stages N and the number of stages M of the emitter output circuits in the emitter output stages 52 and 54 are set to be different, permitting conversion to a voltage having predetermined temperature dependence.

As described above, the temperature dependence of the base-emitter voltage $V_{BE}$ of the transistor is −2 mV/° C. and is constant. Actually, it can be controlled by collector current density $J_C$. The collector current densities of the transistor Q10 and the transistors Q41 to Q4M and the transistors Q21 to Q2N and the transistor Q30 are set to be different, that is, any one of setting of changing the current values of the current sources I1, I2 in the emitter output stages 52 and 54 while the transistor size is the same, setting of changing the emitter size while the current values of the current sources I1, I2 are the same, and setting of changing both the current values of the current sources I1, I2 and the transistor size can change the collector current densities. The emitter output stages 52, 54 set the current densities to be different. Their setting can convert an output to a voltage having wider temperature dependence.

The construction of FIG. 9 is described above with the two collector output stages 51, 53 and the two emitter output stages 52, 54. More than two collector output stages and emitter output stages may be alternately connected.

[Embodiment 4]

Figure 10:
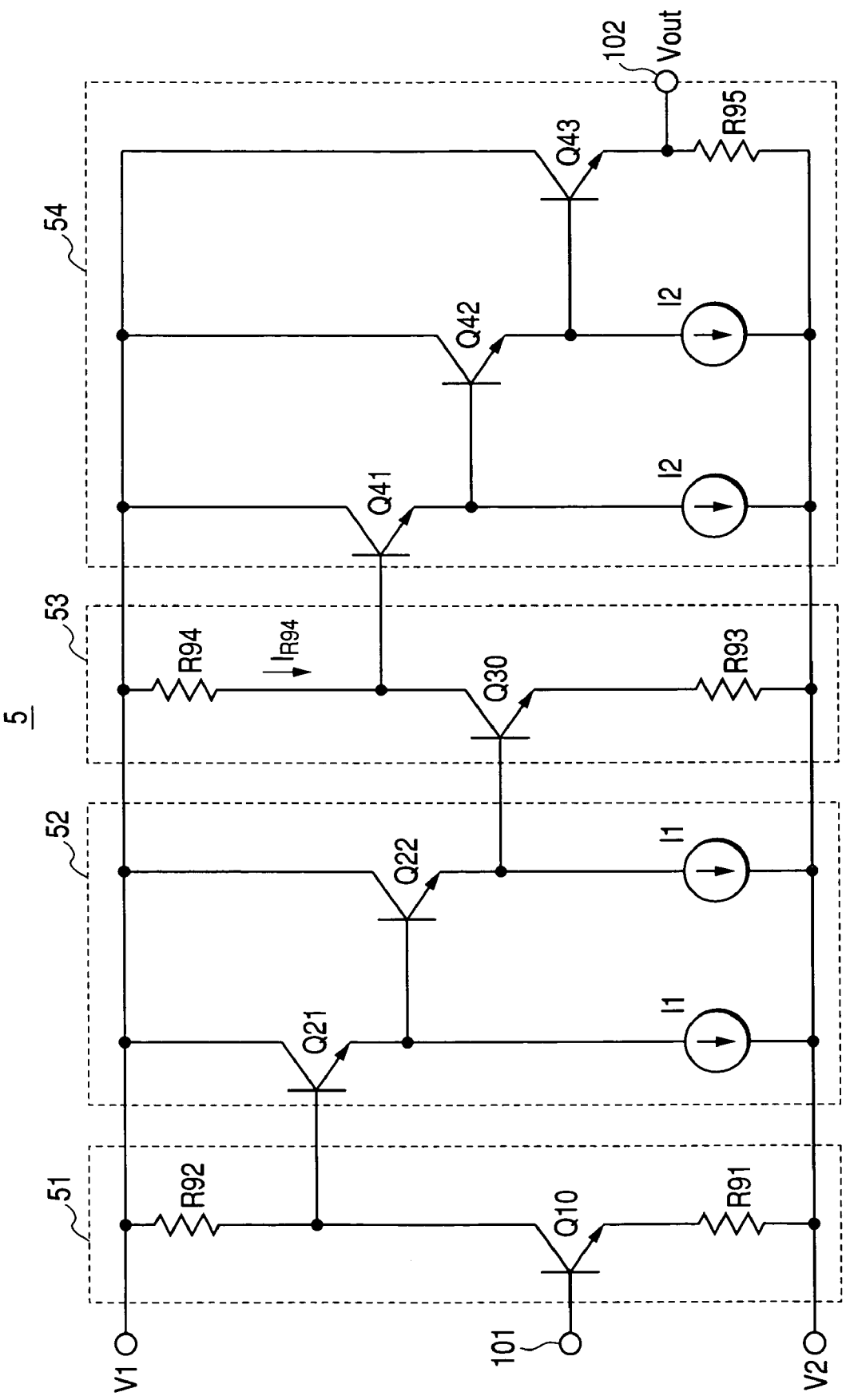
FIG. 10 is a block diagram showing a fourth embodiment of a frequency generator according to the present invention.

FIG. 10 is a diagram showing a fourth embodiment of a frequency generator according to the present invention and shows a more specific construction example of the temperature coefficient converter 5 of FIG. 9. In the construction of the temperature coefficient converter of this embodiment, the number of NPN transistors N of an emitter output stage 52 is two and the number of NPN transistors M of an emitter output stage 54 is three.

In FIG. 10, transistors Q10, Q21 to Q22 and Q30, and Q41 to Q43 have different current densities. The respective base-emitter voltages are $V_{BE1}$, $V_{BE2}$ and $V_{BE3}$. The temperature dependence of voltage Vout of an output terminal 102 is expressed by the following equation (7)

$$\frac{\partial V_{OUT}}{\partial T} = 3 \cdot \left[\frac{\partial V_{BE2}}{\partial T}\right] - 3 \cdot \left[\frac{\partial V_{BE3}}{\partial T}\right] + \left[\frac{\partial V_{IN}}{\partial T} - \frac{\partial V_{BE1}}{\partial T}\right] \quad (7)$$

Here, resistances R93 and R94 are equal and resistances R91 and R92 are also equal. A difference $\Delta\partial V/\partial T$ of the temperature dependence of a voltage of the output terminal 102 and a voltage of an input terminal 101 is expressed by the following equation (8)

$$\Delta\frac{\partial V}{\partial T} = 3 \cdot \left[\frac{\partial V_{BE2}}{\partial T}\right] - 3 \cdot \left[\frac{\partial V_{BE3}}{\partial T}\right] + \left[\frac{\partial V_{BE1}}{\partial T}\right] \quad (8)$$

Current density $J_C$ of each of the transistors is adjusted to add predetermined temperature dependence. For example, when the current density $J_C$ of the transistors Q21 to Q22 and Q30 is set to be 10 times that of the transistor Q10 and the current density $J_C$ of the transistors Q41 to Q43 is set to be 0.1 times that of the transistor Q10, temperature dependence added by the temperature coefficient converter is 3.4 mV/° C. in the case that the temperature dependence of the base-emitter voltage $V_{BE}$ of the transistor Q10 is −2 mV/° C. The ratio of the resistances R92 and R91, R92/R91, is 1. R92/R91 is set to be as small as possible to reduce the gain of a temperature coefficient converter 5, reducing noise of a reference voltage generator 4.

To reduce thermal noise, the resistance of the resistances R91 to R94 must be as small as possible. Diodes of the same size are inserted into the collectors and the emitters of the transistors Q10, Q30 to reduce a voltage applied to both ends of the resistances R91 to R94. The resistance value can be reduced by current consumption equal to or below it. For example, when a voltage of 1.2V is applied to both ends of the resistance R94 and an electric current of $I_{R94}$ is flowed, insertion of a diode having an anode-cathode voltage of 0.8V can reduce a voltage applied to both ends of the resistance R94 to ⅓ which is 0.4V. The resistance value flowing the electric current of $I_{R94}$ can be reduced to ⅓.

The circuit of FIG. 10 compensates fluctuation in an output voltage due to fluctuation in source voltage V1 or V2 by the collector output stage constructed by the transistor Q30. When the source voltage is largely fluctuated by 0.5V or more, the emitter voltage of the transistor Q30 is largely fluctuated. The emitter current and the collector current decided by the emitter voltage of the transistor Q30 and the resistance value of the resistance R93 are fluctuated. Consequently, the base-emitter voltage of the transistor Q30 is fluctuated to fluctuate the output voltage. The circuit of FIG. 10 has the problem that when the source voltage is largely fluctuated by 0.5V or more, it is fluctuated by the source voltage fluctuation.

Figure 20:
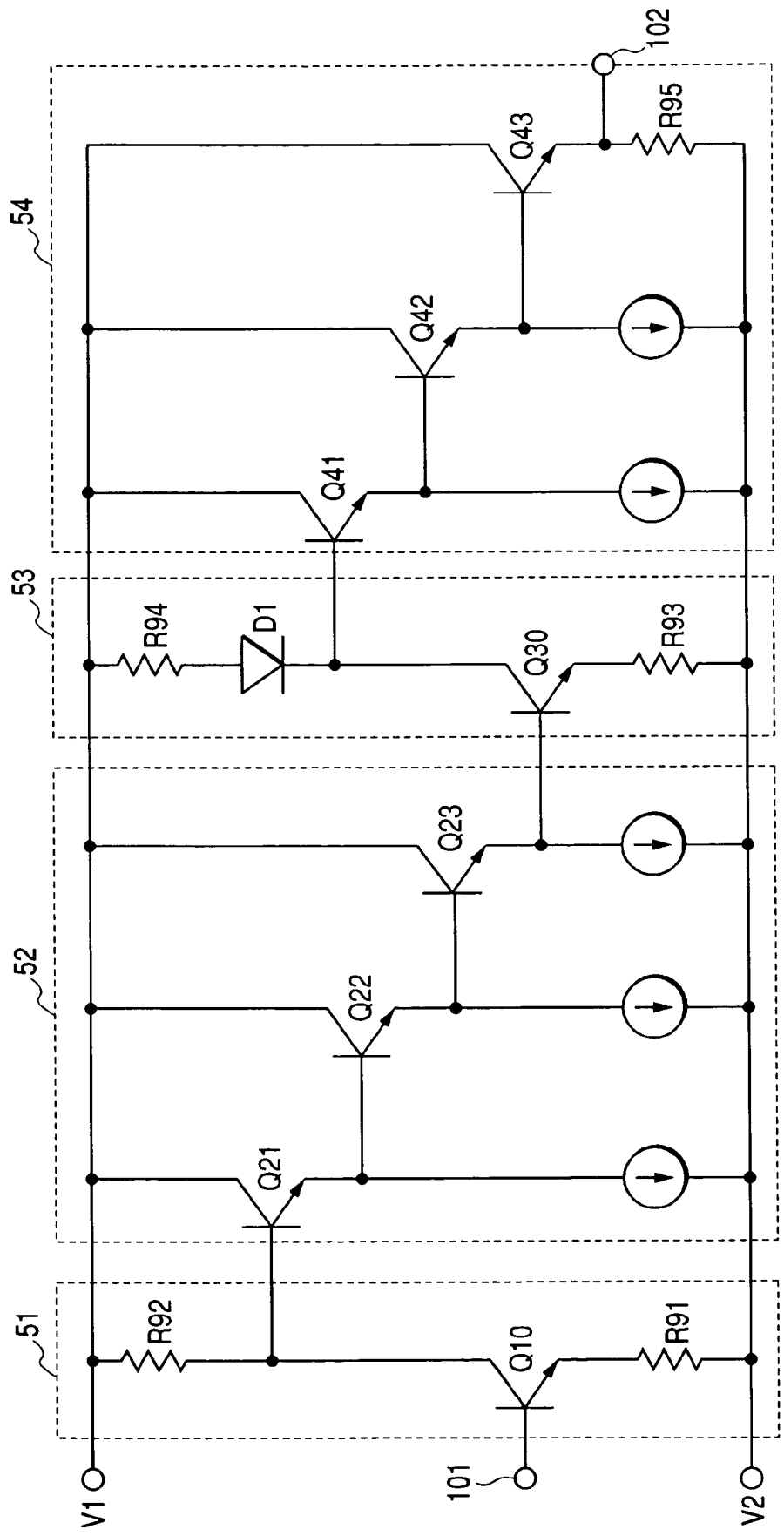
FIG. 20 is a block diagram showing a modification example of the fourth embodiment of the frequency generator according to the present invention.

FIG. 20 is a circuit construction example solving the problem. In the circuit construction of FIG. 20, the number of NPN transistors N of an emitter output stage 52 is three, and the number of NPN transistors M of an emitter output stage 54 is three. Diode D1 having the same emitter size as that of a transistor Q30 is added to the collector of the transistor Q30. The cathode of the diode D1 is connected to the base of a transistor Q41 of the next emitter output stage.

In the construction shown in FIG. 20, fluctuation in the base-emitter voltage of the transistor Q30 due to fluctuation in the source voltage can be cancelled by fluctuation in the anode-cathode voltage of the diode D1. An output voltage more stable to the source voltage can be obtained.

[Embodiment 5]

Figure 11:
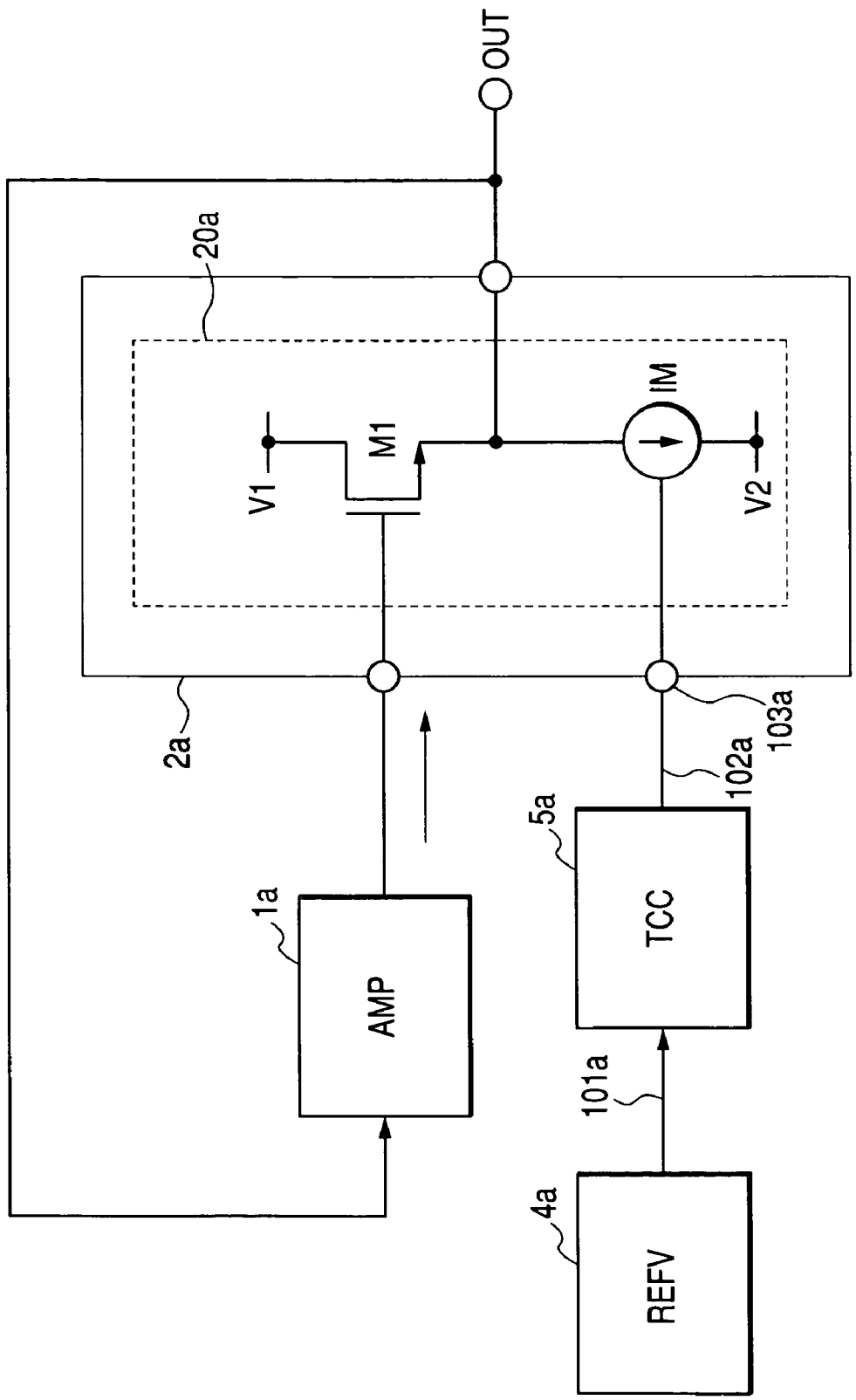
FIG. 11 is a block diagram showing a fifth embodiment of a frequency generator according to the present invention.

FIG. 11 is a block diagram showing a fifth embodiment of a frequency generator according to the present invention. The frequency generator of this embodiment has an amplifier 1a, a buffer circuit 2a constructed by a source follower circuit 20a feeding back an output of the amplifier 1a to its input, a reference voltage generator 4a, and a temperature coefficient converter 5a.

The source follower circuit 2a has a delay-time control terminal 103a controlling current source IM supplying a bias current to control delay time of the source follower circuit 20a. The reference voltage generator 4a outputs a voltage having predetermined dependence stable to temperature and is connected to the temperature coefficient converter 5a. The temperature coefficient converter 5a converts the output 101a of the reference voltage generator 4a to the voltage output 102a having temperature dependence necessary for allowing delay time of the source follower circuit 20a to have constant or predetermined temperature dependence to input it to the delay-time control terminal 103a.

The construction can obtain a frequency generator outputting an oscillation frequency highly stable to temperature or an oscillation frequency having predetermined temperature dependence.

This embodiment, as compared with the above other embodiments, constructs the buffer circuit of the source follower circuit to control its bias current. Control is easy. It can reduce a source voltage using a MOS transistor.

Figure 12:
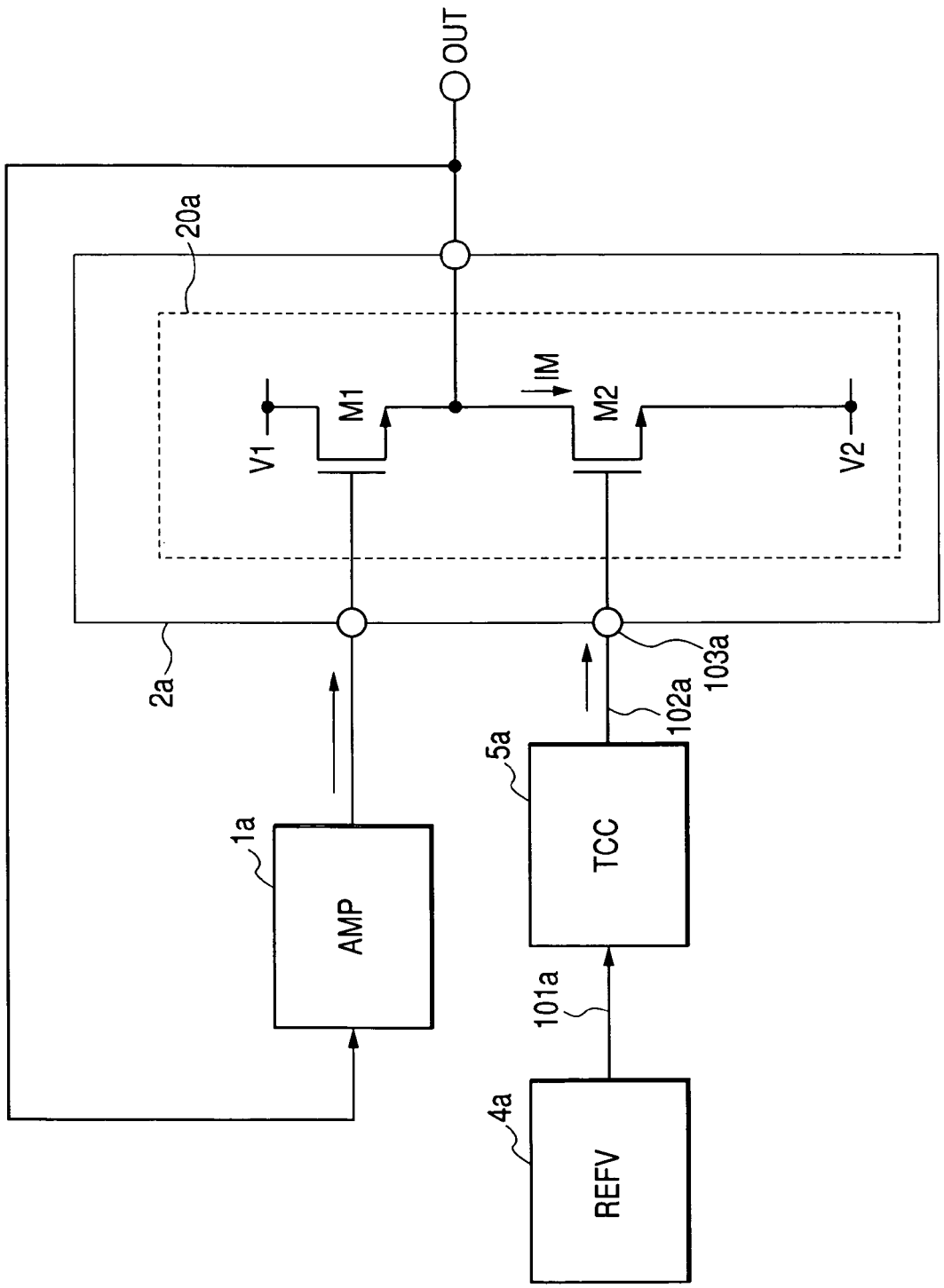
FIG. 12 is a block diagram showing a construction example of a current source supplying a bias current of FIG. 11.

FIG. 12 is a diagram showing the current source IM supplying a bias current of FIG. 11 by a specific circuit construction example as an example. Current source IM of a source follower circuit 20a is constructed by NMOS transistor M2 and controls a bias current by the gate potential of the MOS transistor M2. As compared with FIG. 11, the current source IM is constructed of the MOS transistor M2. The impedance seen from the drain of the MOS transistor M2 of the current source IM is high and is excellent as the current source. The bias current is easily controlled.

[Embodiment 6]

Figure 13:
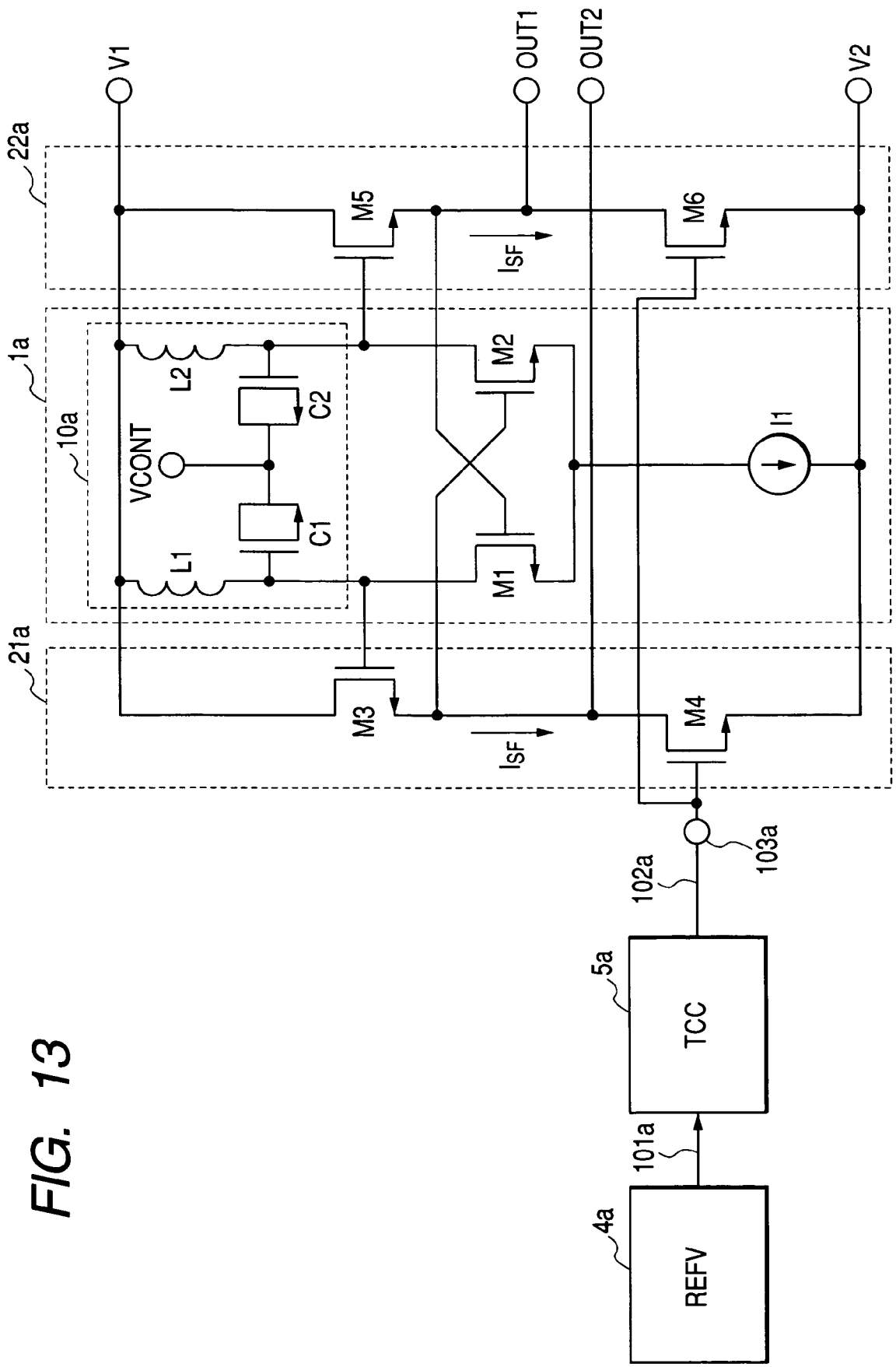
FIG. 13 is a block diagram showing a sixth embodiment of a frequency generator according to the present invention.

FIG. 13 is a block diagram showing a sixth embodiment of a frequency generator according to the present invention. The frequency generator of this embodiment, as in FIG. 6, has a differential amplifier 1a having an LC resonance circuit 10a as a load, buffer circuits 21a, 22a feeding back an output of the differential amplifier to its input, a reference voltage generator 4a, and a temperature coefficient converter 5a. The differential amplifier 1a and the buffer circuits 21a, 22a are constructed by NMOS transistors.

The resonance circuit 10a is a circuit in which inductors L1, L2 and variable capacitors C1, C2 are connected in parallel. The differential amplifier 1a has the resonance circuit 10a as a load and has a differential transistor pair M1, M2 of the NMOS transistors and constant-current source I1. Control terminal VCONT of the variable capacitors C1, C2 controls an oscillation frequency. The amplifier 1a amplifies signals inputted from the gates of the differential transistor pair M1, M2 of the NMOS transistors by a load having a resonance frequency and outputs them from the drains of the NMOS transistors M1, M2.

The feedback buffer circuits 21a, 22a are constructed of source follower circuits and receive, as inputs, outputs of the drains of the NMOS transistors M1, M2 of the amplifier 1a to input them to the gates of the M3, M5. Outputs of the sources of the NMOS transistors M3, M5 are connected to output terminals OUT2, OUT1 and are inputted to the M2, M1 of the amplifier. Bias currents ISF of the buffer circuits 21a, 22a constructed by source follower circuits are decided by the gate potentials and the size of the gate widths of the NMOS transistors M4, M6.

An output of the reference voltage generator 4a is inputted to the temperature coefficient converter 5a. An output of the temperature coefficient converter 5a is inputted to a delay-time control terminal 103a connected to the gates of the NMOS transistors M4, M6. The bias currents ISF of the feedback buffer circuits 21a, 22a are controlled.

In this embodiment, as compared with the embodiment of FIGS. 11 and 12, the amplifier is the differential amplifier having the LC resonance circuit as a load. Phase noise is good and the stability to a source voltage is high.

As compared with the frequency generator using the bipolar transistors of the embodiment of FIG. 6, the MOS transistors are used. When the source voltage necessary for the operation of the frequency generator of FIG. 6 is 3V and threshold voltage Vth of the MOS transistor is 0.4V, the source voltage can be reduced to about 2V.

Figure 14:
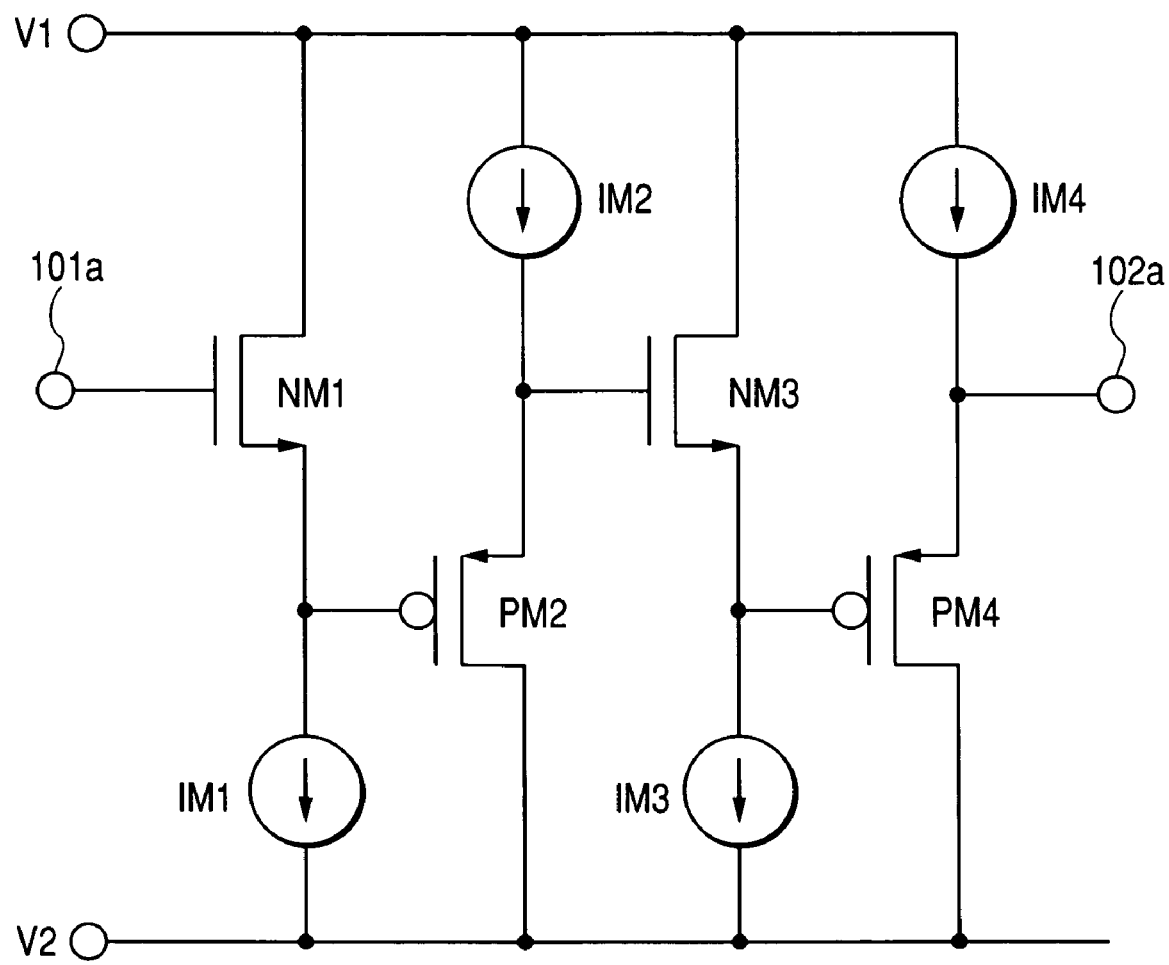
FIG. 14 is a circuit diagram showing a construction example of a temperature coefficient converter of FIG. 13.

FIG. 14 is a circuit diagram showing a specific construction example of the temperature coefficient converter 5a of this embodiment. The temperature coefficient converter 5a has NMOS transistors NM1, NM3, PMOS transistors PM2, PM4, and current sources IM1, IM2, IM3 and IM4.

The temperature coefficient converter 5a uses the fact that the temperature dependence of the gate-source voltage of the NMOS transistor is different from that of the gate-source voltage of the PMOS transistor to add the difference in temperature dependence of both to the temperature dependence of an input voltage inputted to an input terminal 101a, outputting it from an output terminal 102a.

Figure 21:
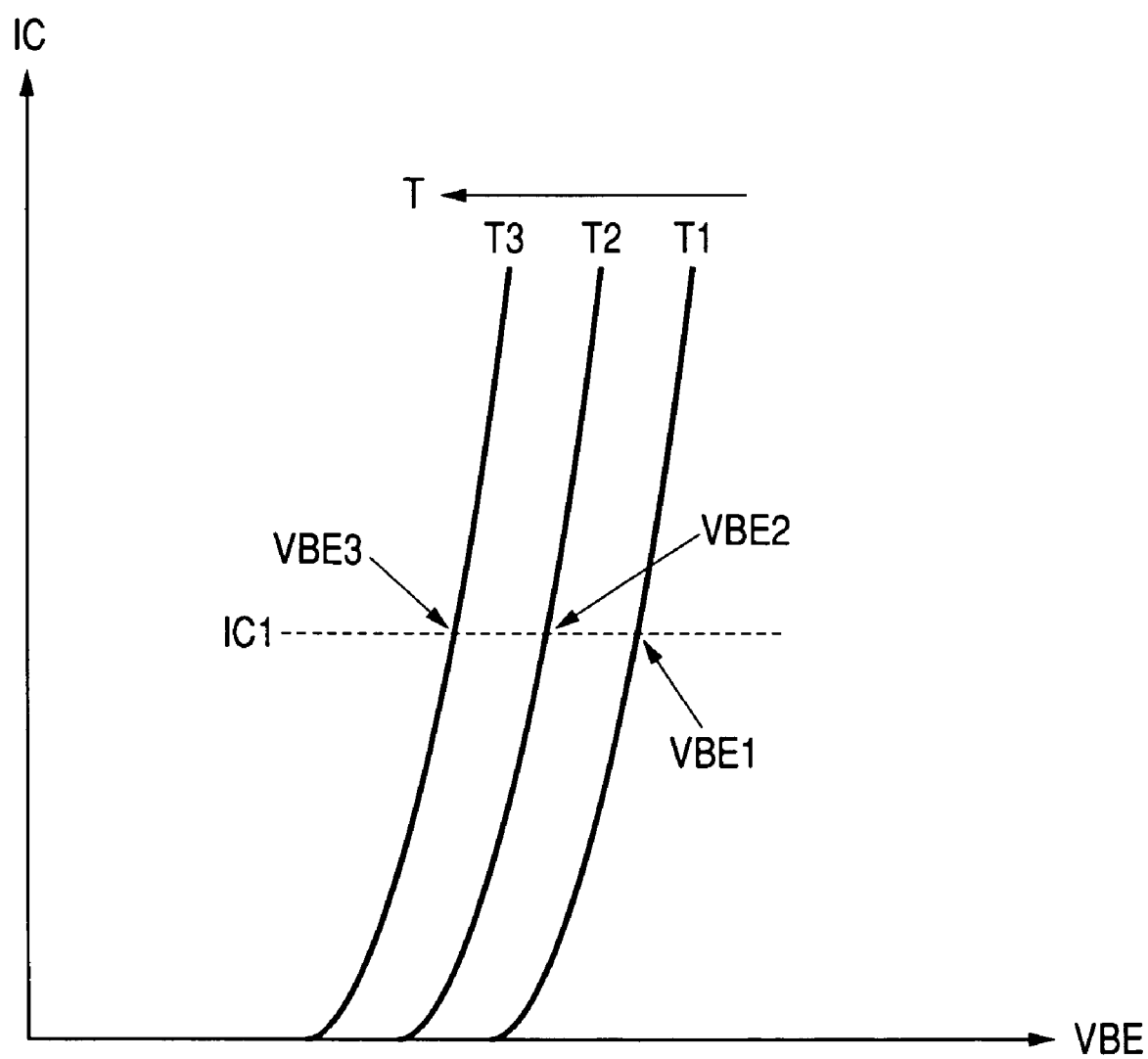
FIG. 21 is a characteristic line diagram showing temperature dependence of a collector current and base-emitter voltages of a bipolar transistor.

The relation between collector current IC and base-emitter voltage VBE of the bipolar transistor is as shown in FIG. 21. For example, the base-emitter voltage VBE when the collector current indicated by the dotted line is IC1 constant is smaller as VBE1, VBE2 and VBE3 as temperature T is higher as T1, T2 and T3. The sign of the temperature dependence is not inverted. Such temperature dependence of the bipolar transistor is disclosed in Non-Patent Document 1.

Figure 22:
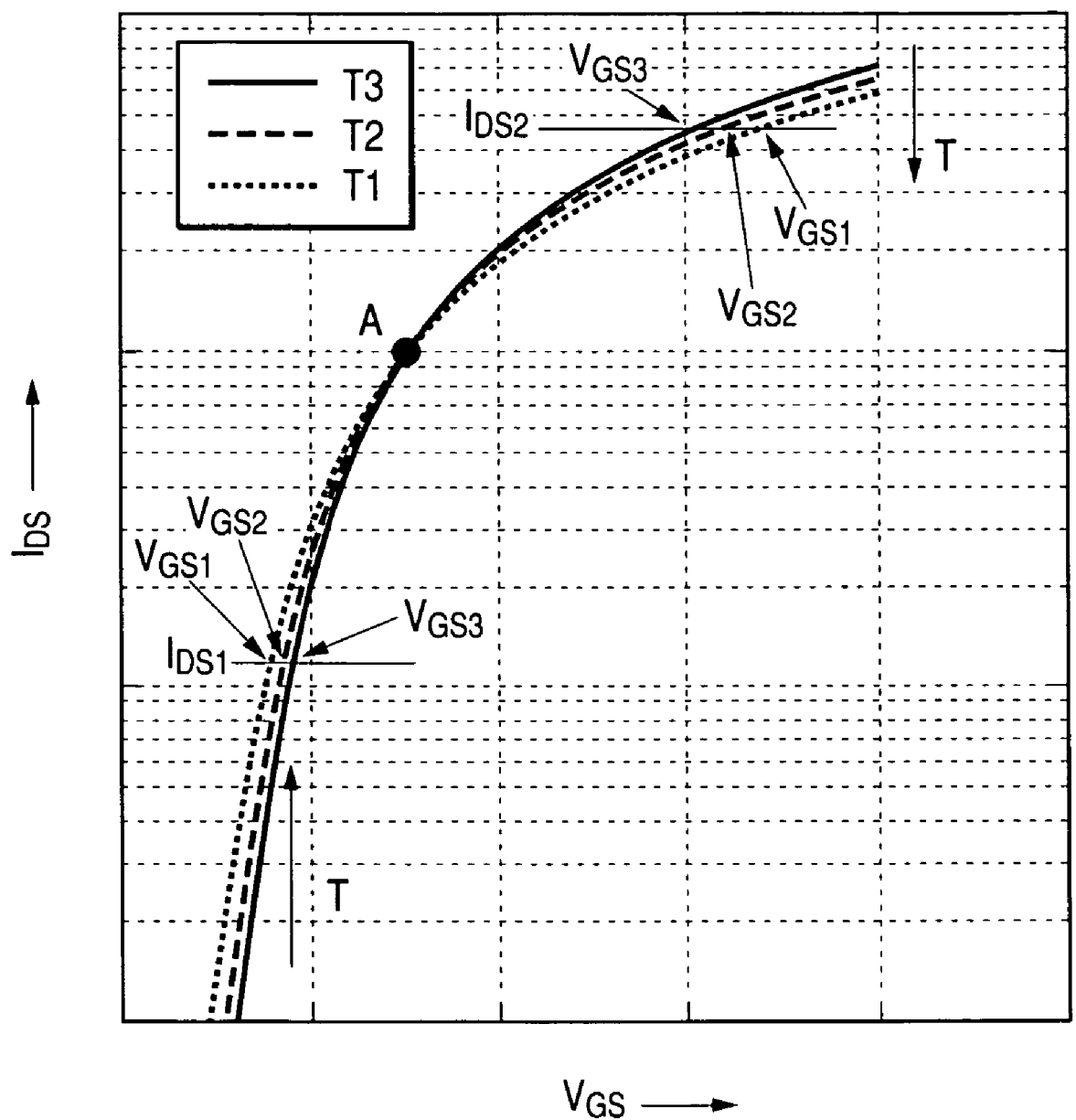
FIG. 22 is a characteristic line diagram showing temperature dependence of drain currents and gate-source voltages of a MOS transistor.

In the relation between drain current IDS and gate-source voltage VGS of the NMOS transistor, the sign of the temperature dependence is inverted at A point as shown in FIG. 22. In the drain current IDS1 smaller than the A point, as the temperature T rises as indicated by T1 (dotted line), T2 (dashed line) and T3 (solid line), the gate-source voltage VGS is larger as indicated by VGS1, VGS2 and VGS3. In the drain current IDS2 larger than the A point, the gate-source voltage VGS is smaller as indicated by VGS1, VGS2 and VGS3 with temperature rise. The sign of the temperature dependence is inverted.

The temperature dependence of the MOS transistor is disclosed in Non-Patent Document 2. In the temperature dependence of the PMOS transistor, in FIG. 22, when the gate-source voltage VGS is read as "−VGS" and the drain current is read as "−IDS", the characteristic of the PMOS transistor is obtained. In the PMOS transistor, like the NMOS transistor, the sign of the temperature dependence of the gate-source voltage is inverted.

When the temperature coefficient converter 5a is constructed of the MOS transistor, the gate-source voltage VGS must be operated on a voltage side higher or lower than the A point at which temperature dependence is zero. The region in which the gate-source voltage VGS is lower than the A point is a region in which the VGS of the MOS transistor is lower than the threshold voltage Vth and is a region in which the MOS transistor is not in the sufficient ON state. The region in which the gate-source voltage VGS is higher than the A point is a region in which the channel region on the surface of a semiconductor is sufficiently inverted in excess of the threshold voltage Vth and the MOS transistor is in the ON state.

The temperature coefficient converter 5a used in this embodiment is used in the region in which the VGS of the MOS transistor is always in the ON state in excess of the threshold voltage by the current source of a current mirror construction. The sign of the temperature dependence of the MOS transistor is not inverted in circuit operation. The temperature dependence in which the VGS is reduced with temperature rise is used.

The temperature coefficient converter 5a of the MOS transistor construction shown in FIG. 14 optimizes the size of the MOS transistors NM1, PM2, NM3 and PM4 and the bias currents IM1, IM2, IM3 and IM4 according to the gate-source voltage VGS used to output an output voltage having predetermined temperature dependence.

Figure 23:
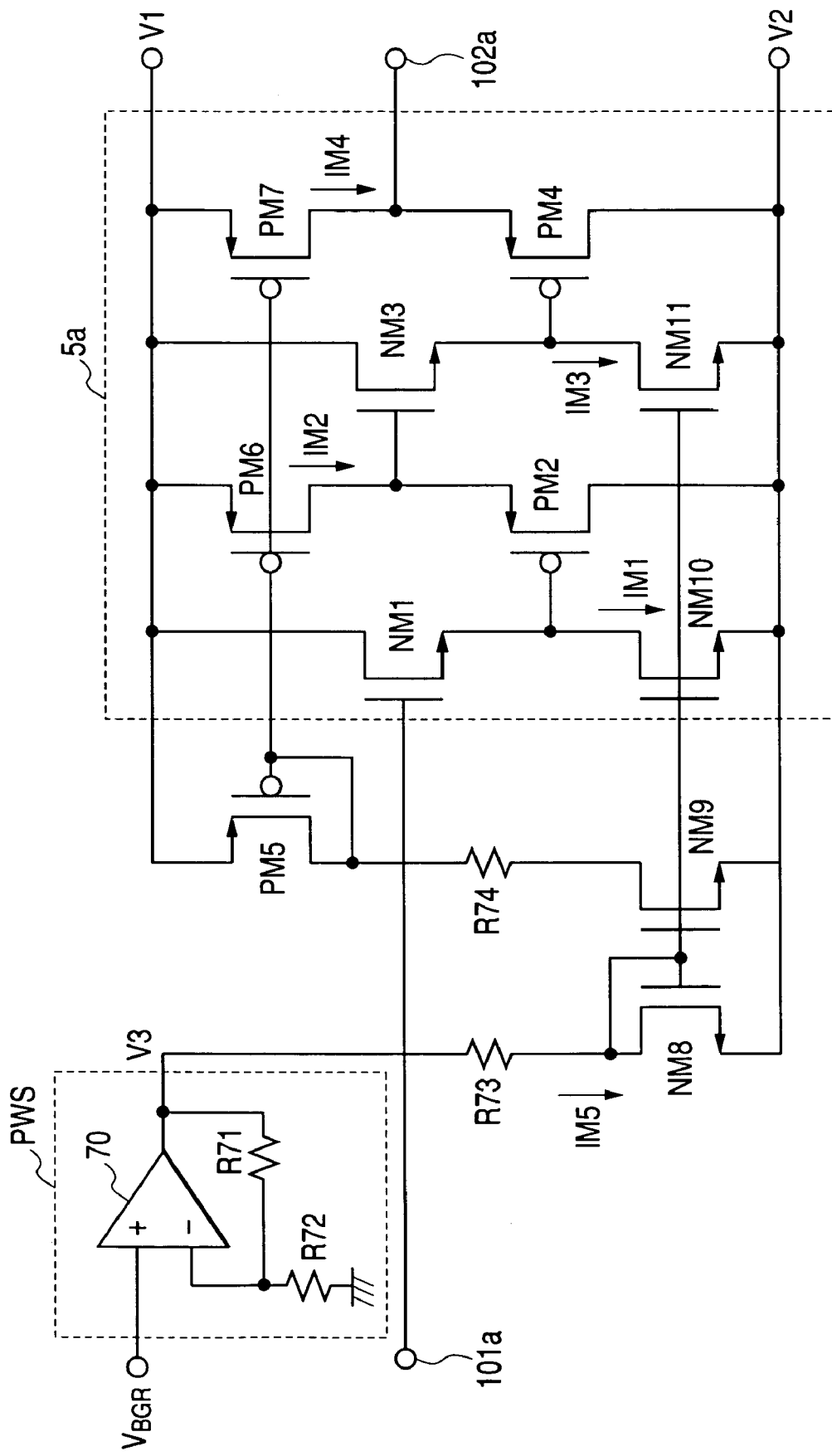
FIG. 23 is a diagram showing a construction in which the temperature coefficient converter of FIG. 14 is a circuit stable to source voltage fluctuation.

FIG. 23 is a construction example for stabilizing an output voltage outputted from the output terminal 102a of the temperature coefficient converter 5a shown in FIG. 14 to fluctuation in source voltage V1 or V2.

In the temperature coefficient converter 5a of FIG. 23, the current sources IM1, IM3 indicated by the symbols in FIG. 14 are shown by a specific circuit construction using NMOS transistors NM10, NM11 of a current mirror construction in which the gate of diode-connected NMOS transistor NM8 is shareably connected to the gates. The current sources IM2, IM4 are shown by a specific circuit construction using PMOS transistors PM6, PM7 of a current mirror construction in which the gate of diode-connected PMOS transistor PM5 is shareably connected to the gates.

FIG. 23 shows a circuit construction having the temperature coefficient converter 5a shown in FIG. 14 and stabilizing power source PWS having an operation amplifier 70 and resistances R71, R72 and supplying a stable electric current decided by output voltage V3 of the stabilizing power source and resistance R73 to the NMOS transistor NM8.

Output voltage VBGR of the bandgap reference circuit is inputted to the non-inverted input terminal of the operation amplifier 70. A voltage obtained by dividing the output voltage V3 by the resistances R71 and R72 is inputted to inverted input terminal of the operation amplifier 70. The output voltage V3 is expressed by V3=VBGR×(R71+R72)/R72. When the values of the resistances R71 and R72 are equal, a stable voltage of 2VBGR is obtained. The output V3 of the stabilizing power source circuit PWS is supplied via the resistance R73 to the NMOS transistor NM8. The resistance R73 is a resistance adjusting the current value of current source IM5. The drain of NMOS transistor NM9 whose gate is connected to the gate of the NMOS transistor NM8 is connected to the drain of the diode-connected PMOS transistor PM5 via resistance R74. The resistance R74 is a resistance for equalizing the drain voltages of the NMOS transistors NM8 and NM9.

Such construction using the stabilizing power source PWS can obtain the current source IM5 with a stable reference to fluctuation in the source voltage V1 or V2. The current source IM5 with the reference is used to construct the current source circuit in the temperature coefficient converter 5a by current mirror. An output voltage outputted from the output terminal 102a of the temperature coefficient converter 5a is stable to fluctuation in the source voltage V1 or V2. The MOS transistors are operated in a saturation region. In the temperature coefficient converter 5a of FIG. 23, when a voltage outputted from the output terminal 102a is allowed to have temperature dependence risen with temperature, the output voltage is applied to the gates of the MOS transistors NM4, NM6 controlling the bias currents ISF of the source follower circuits of FIG. 13. It is stable to fluctuation in the source voltage V1 or V2 and can constantly control the delay time tpd of the source follower circuit to temperature. The voltage VBGR inputted to the non-inverted terminal of the stabilizing source voltage may serve as an output voltage of the reference voltage generator 4 when the reference voltage generator 4 is constructed of the bandgap reference circuit.

[Embodiment 7]

Figure 15:
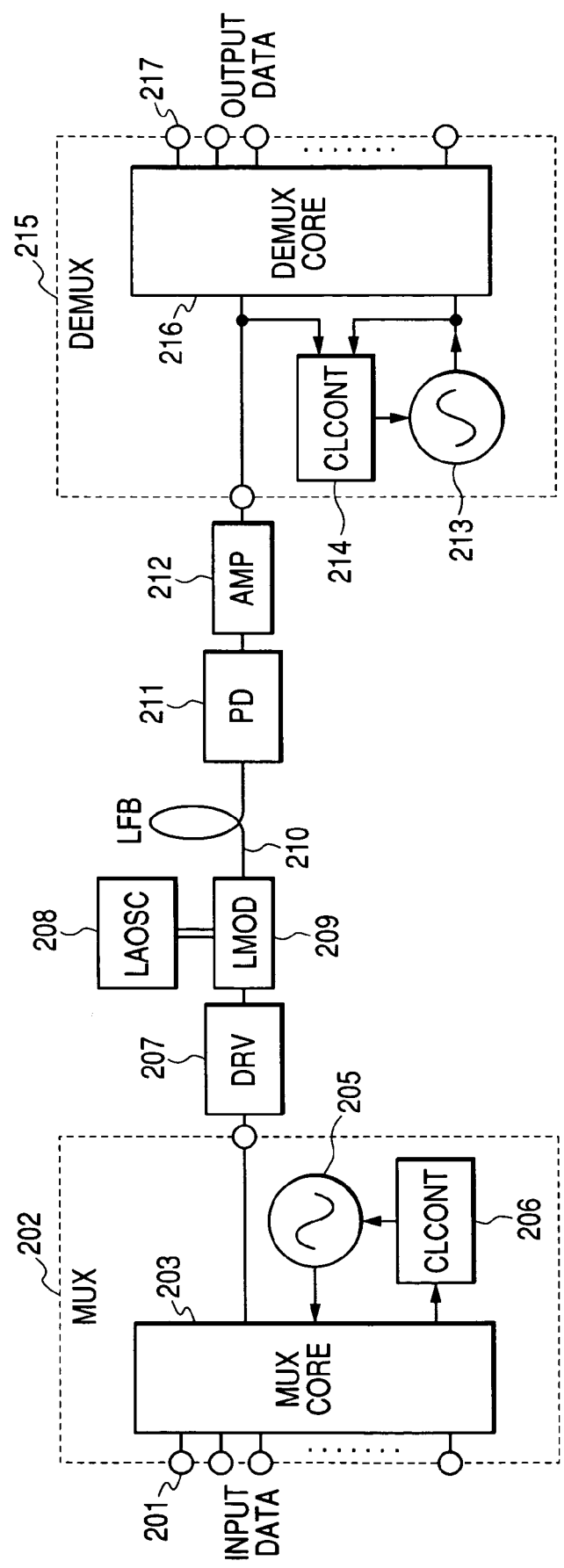
FIG. 15 is a block diagram of an optical communication system showing a seventh embodiment using the frequency generator according to the present invention.

FIG. 15 is a block diagram showing a seventh embodiment of the present invention and an example of an optical communication system using the frequency generator according to the present invention. The transmitter side of the optical communication system has a multiplexer (MUX) 202, a driver 207 (DRV), a laser oscillator (LAOSC) 208, and an optical modulator (LMOD) 209. The receiver side has a photo detector (PD) 211, an amplifier (AMP) 212, and a demultiplexer (DEMUX) 215. The transmitter side is connected to the receiver side via an optical fiber (LFB) 210.

The multiplexer 202 on the transmitter side has a MUX-core circuit 203 multiplexing a plurality of low-speed input data signals from a plurality of input terminals 201 into a high-speed signal, a clock-frequency control circuit (CL-CONT) 206, and a frequency generator 205 generating a reference signal of the MUX-core circuit. The driver 207 drives the optical modulator 209 according to an output signal of the multiplexer 202. The optical modulator 209 modulates a continuous wave from the laser oscillator 208 to an optical signal to transmit it via the optical fiber 210 to the receiver side.

On the receiver side, the photo detector 211 changes it to an electric signal by photoelectric conversion to input an output of the amplifier 212 to the demultiplexer 215. The demultiplexer 215 has a DEMUX-core 216 demultiplexing a high-speed signal into a plurality of low-speed signals, a clock-frequency control circuit 214, and a frequency generator 213 generating a reference signal of the DEMUX-core and demultiplexes a high-speed signal into a plurality of low-speed signals to output an output data signal from a plurality of output terminals 217.

The frequency generator of the present invention of any one of the constructions explained in Embodiments 1 to 8 is used as the frequency generator 205 on the transmitter side of the thus-constructed optical communication system and the frequency generator 213 on the receiver side.

The frequency generator of the present invention is used to suppress oscillation frequency fluctuation to temperature variation. The optical communication system can be operated in a wide temperature range. The corresponding temperature variation can be reduced in the frequency tuning range of the frequency generator. The usable frequency tuning range is increased to oscillation frequency fluctuation due to process variation to improve the yield of the optical communication system.

Figure 18:
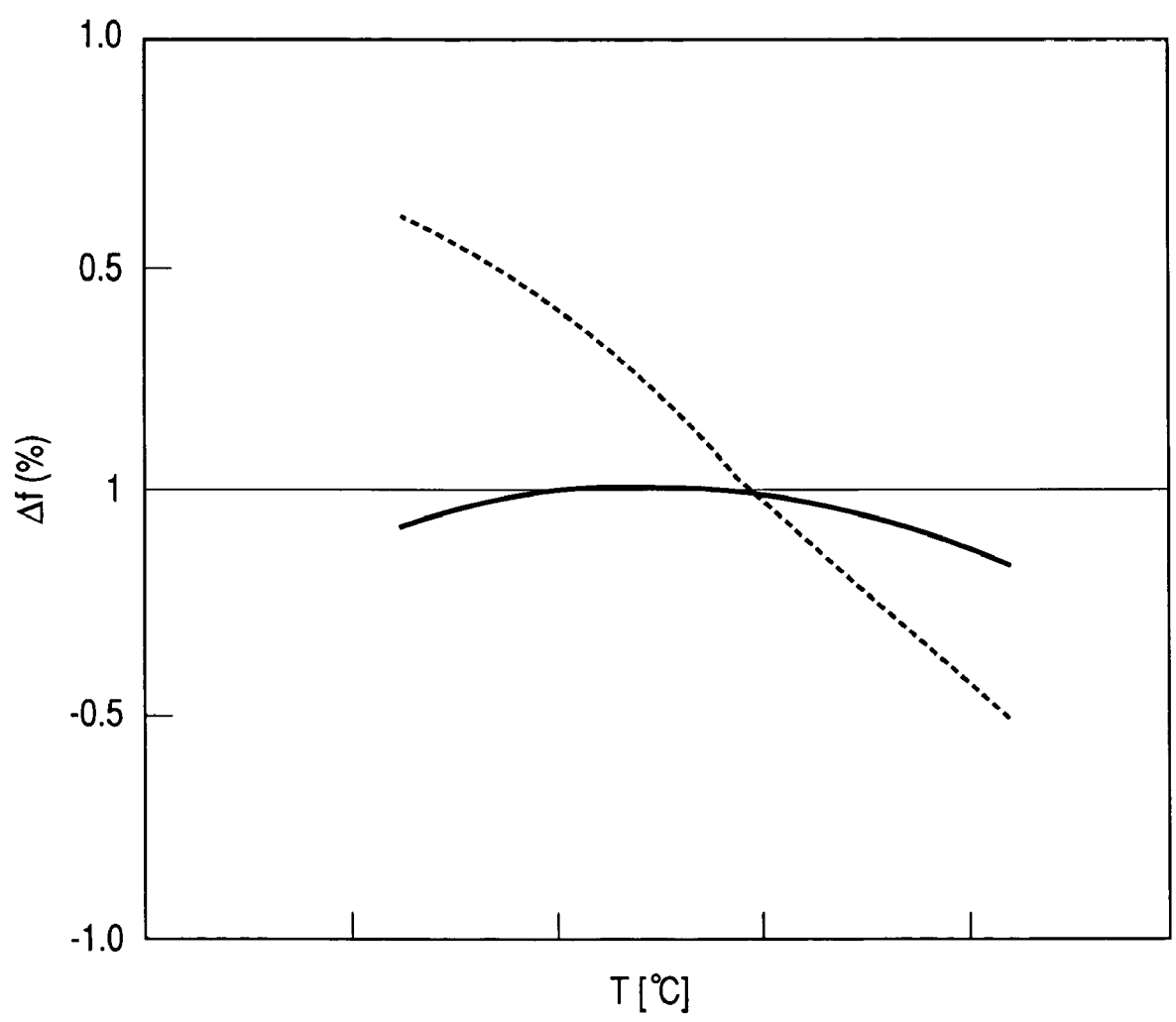
FIG. 18 is a characteristic line diagram showing the temperature dependence of an oscillation frequency of the frequency generator according to the present invention as compared with the prior art.
Figure 19:
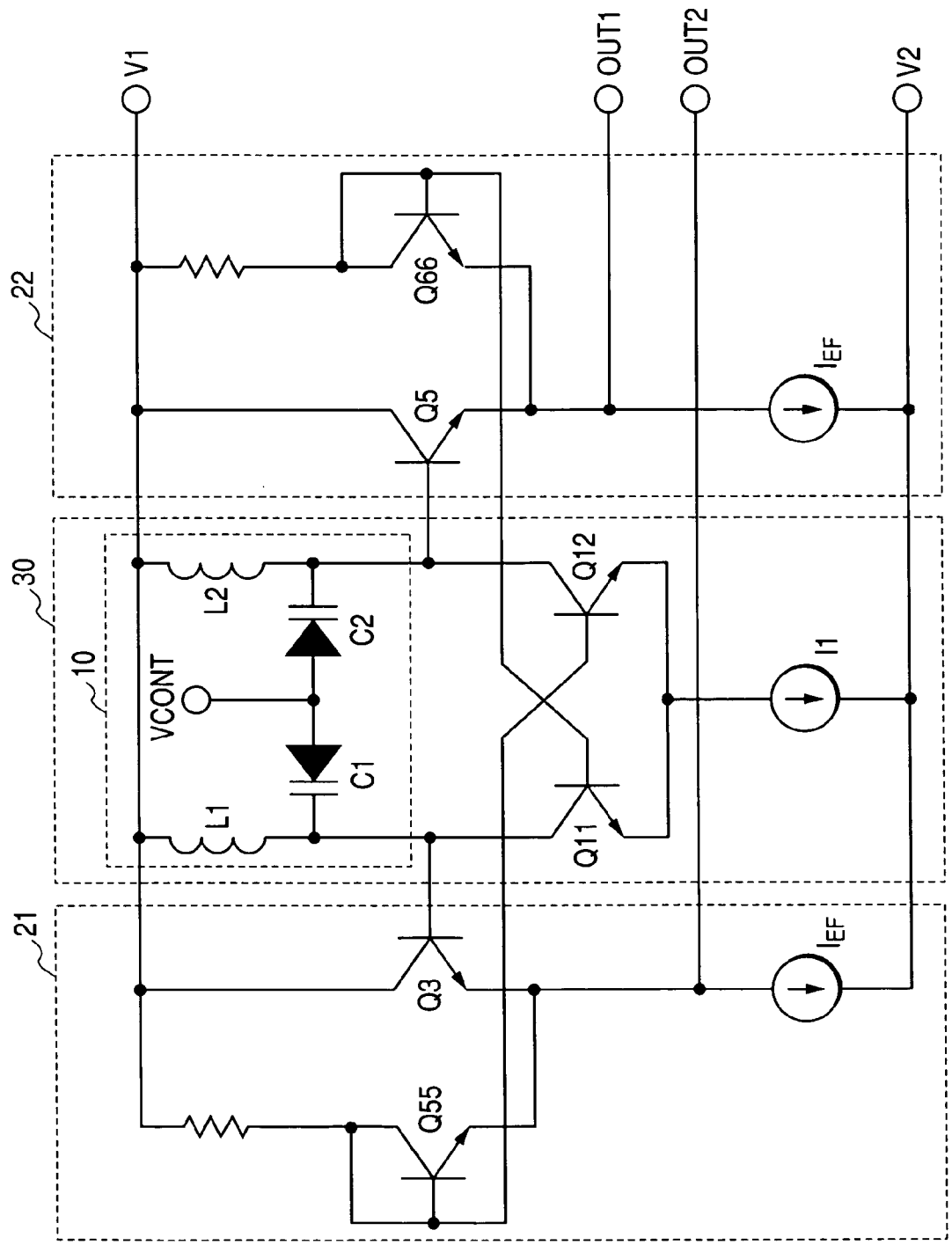
FIG. 19 is a circuit diagram showing a construction example in which a voltage stabilizing circuit in the prior art is added to the frequency generator of FIG. 1.

FIG. 18 shows measured results of temperature dependence of an oscillation frequency in the frequency generator operated at 40 GHz when applying the frequency generator of the embodiment of FIG. 6 to an optical communication system at 40 Gbps. The horizontal axis indicates temperature T(° C.) and the vertical axis indicates oscillation frequency fluctuation Δf(%). The dashed line indicates the case of the frequency generator of the prior art construction shown in FIG. 1. The solid line indicates the case of the frequency generator of the present invention shown in FIG. 6. In the prior art construction, an oscillation frequency is fluctuated by 1.2% in the temperature range of 25 to 85° C. In the construction of the present invention, an oscillation frequency is fluctuated by 0.2% in the same temperature range, which exhibits very little fluctuation.

[Embodiment 8]

Figure 16:
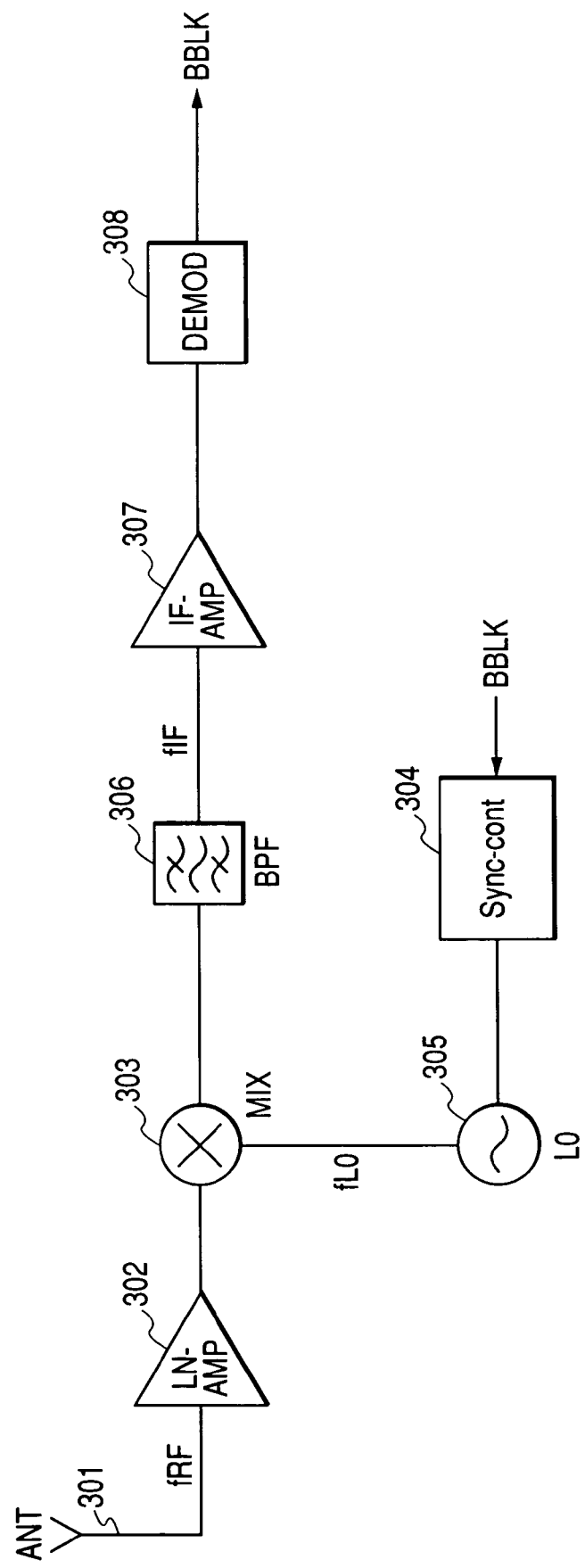
FIG. 16 is a block diagram of a wireless communication system showing an eighth embodiment using the frequency generator according to the present invention.

FIG. 16 is a block diagram of an eighth embodiment of the present invention and an example of a wireless communication system using the frequency generator according to the present invention. This embodiment shows the case of applying the present invention to a wireless receiver of a heterodyne form.

In the wireless receiver of a heterodyne form, radio frequency signal fRF received by an antenna (ANT) 301 is amplified by a low noise amplifier (AMP) 302 to be inputted to one of input terminals of a mixer (MIX) 303. Output signal fLO of a local oscillator (LO) 305 is controlled by a frequency generator control circuit (Sync_cont) 304 operated upon reception of a signal from a baseband circuit part (BBLK) to be inputted to the other terminal of the mixer 303. In the output of the mixer 303, a carrier wave frequency of the reception signal fRF is lowered. A band-pass filter (BPF) 306 attenuates the unnecessary frequency component. It is amplified by an intermediate frequency amplifier (IF-AMP) 307. A signal is fetched by a demodulator (DEMOD) 308 to be sent to a baseband circuit part, not shown. The baseband circuit part is a circuit part performing predetermined operation processing to the fetched signal.

The frequency generator of the present invention of any one of the constructions explained in Embodiments 1 to 8 is used as the local oscillator 305 of the thus-constructed wireless communication system of a heterodyne form. This can suppress oscillation frequency fluctuation to temperature variation to operate the wireless communication system in a wide temperature range. The corresponding temperature variation can be reduced in the frequency tuning range of the local oscillator using the frequency generator of the present invention. The usable frequency tuning range is increased to oscillation frequency fluctuation due to process variation to improve the yield of the wireless communication system of a heterodyne form.

[Embodiment 9]

Figure 17:
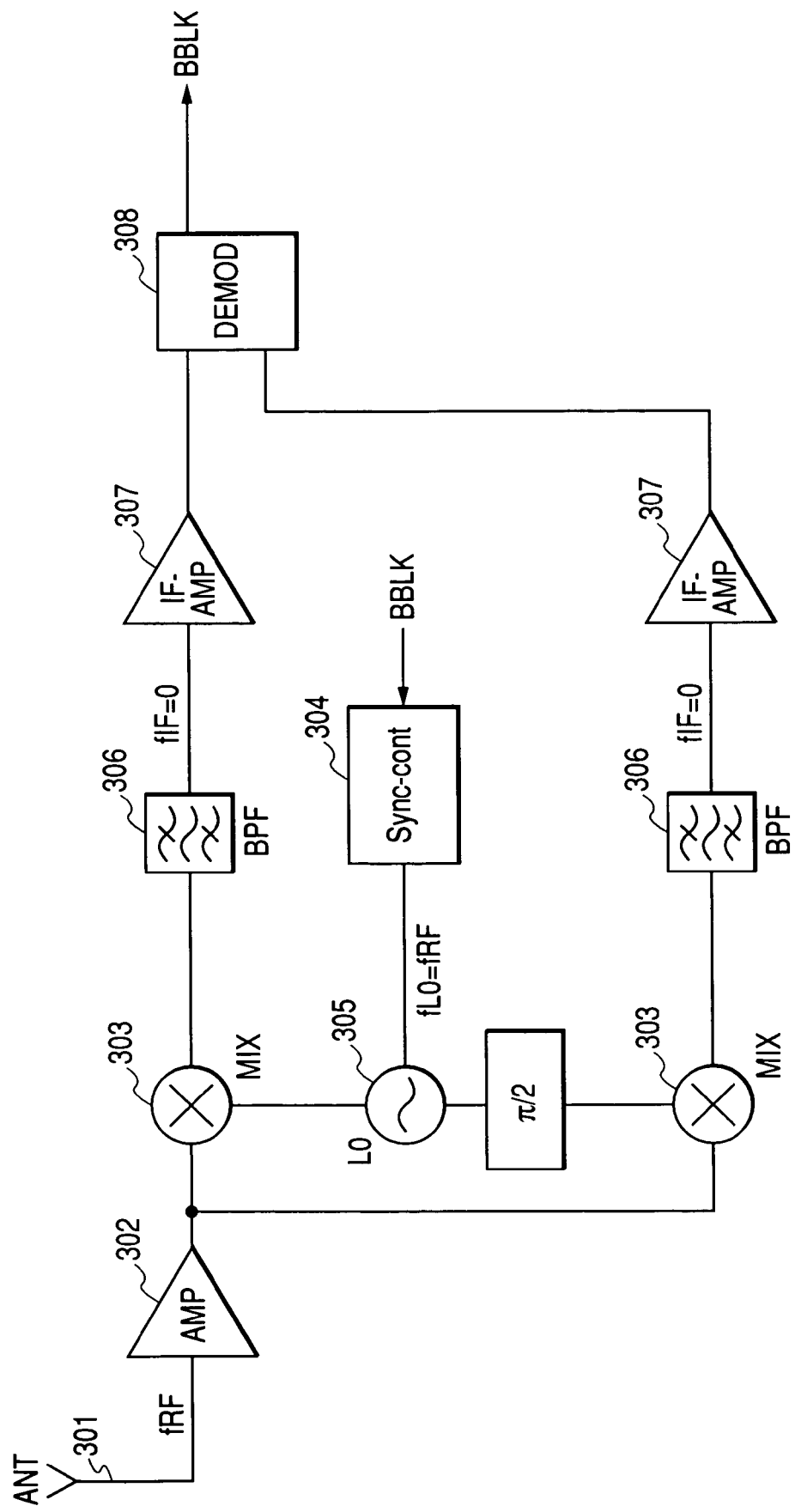
FIG. 17 is a block diagram of a wireless communication system showing a ninth embodiment using the frequency generator according to the present invention.

FIG. 17 is a block diagram of a ninth embodiment of the present invention and another embodiment of a wireless communication system using the frequency generator according to the present invention. This embodiment shows the case of applying the present invention to a wireless receiver of a direct conversion form.

In the wireless receiver of a direct conversion form, radio frequency signal fRF received by an antenna 301 is amplified by a low noise amplifier 302 to be input signals of two mixers 303, 303. Output signal fLO (here, fLO=fRF) of a local oscillator circuit (LO) 305 controlled by a frequency generator control circuit 304 is branched into two to be input signals of the mixers with a phase difference of 90° (that is, π/2 [radian/second]). The carrier wave frequencies of the signals amplified by the amplifier 302 are lowered in the outputs of the two mixers to attenuate the unnecessary frequency components by band-pass filters 306 (here, IF frequency fIF=0) to be amplified by IF amplifiers 307. A demodulator 308 uses outputs of the two IF amplifiers 307, 307 to fetch a signal and sends it to a baseband circuit part (BBLK), not shown.

The frequency generator of the present invention of any one of the constructions explained in Embodiments 1 to 8 is used as the local oscillator circuit 305 of the thus-constructed wireless receiver of a direct conversion form. This can suppress oscillation frequency fluctuation to temperature variation to operate the wireless communication system of a direct conversion form in a wide temperature range. The corresponding temperature variation can be reduced in the frequency tuning range of the local oscillator circuit using the frequency generator of the present invention. The usable frequency tuning range is increased to oscillation frequency fluctuation due to process variation to improve the yield of the wireless communication system of a direct conversion form.

The frequency generator according to the present invention controls delay time of an emitter follower circuit constructing a feedback buffer circuit by a bias current according to temperature to obtain an oscillation frequency stable to temperature. The oscillation frequency is allowed to have predetermined temperature dependence.

The frequency generator according to the present invention is used as a frequency generator of a wireless communication system or an optical communication system to suppress oscillation frequency fluctuation to temperature variation, thereby operating the wireless communication system or the optical communication system in a wide temperature range.

What is claimed is:

1. A frequency generator comprising:
an amplifier amplifying an input signal;
a buffer circuit feeding back an output signal of said amplifier to the input of said amplifier;
a first current source circuit provided in said buffer circuit; and
a temperature coefficient converter inputting an output to the control terminal of said first current source circuit,
wherein a current value of said first current source circuit is controlled to be increased in proportion to temperature by said temperature coefficient converter.

2. The frequency generator according to claim 1, wherein an output voltage of a reference voltage generator outputting a voltage having constant temperature dependence to temperature is inputted to said temperature coefficient converter.

3. The frequency generator according to claim 2,
wherein said buffer circuit is an emitter follower circuit,
wherein said first current source circuit is a bias current source provided on the emitter side of said emitter follower circuit.

4. The frequency generator according to claim 3,
wherein said temperature coefficient converter comprises first and second PNP transistors, first and second NPN transistors, and first, second and third resistances,
wherein the collector of said first PNP transistor is connected to the base, and the emitter is connected to a first source voltage,
wherein the collector of said first NPN transistor is connected to the collector of said first PNP transistor, and the emitter is connected via said first resistance to a second source voltage,
wherein the emitter of said second PNP transistor is connected to said first source voltage, the gate is connected to the gate of said first PNP transistor, and the collector is connected via said second resistance to said second source voltage,
wherein the collector of said second NPN transistor is connected to said first source voltage, the base is connected to the collector of said second PNP transistor, and the emitter is connected to the output terminal and is connected via said third resistance to said second source voltage,
wherein the base of said first NPN transistor is an input terminal, an output voltage of the reference voltage generator outputting a voltage having constant temperature dependence to temperature is inputted to said input terminal, and said output terminal is connected to the control terminal of said first current source circuit.

5. The frequency generator according to claim 3,
wherein said temperature coefficient converter comprises:
a first collector output stage having the base of a bipolar transistor as an input and the collector as an output;
a second collector output stage having the base of a bipolar transistor as an input and the collector as an output;
a first emitter output stage including a bipolar transistor and a bias current source connected to its emitter between said first collector output stage and said second collector output stage in which N (N is an integer) circuits in which the base of said bipolar transistor is an input and the emitter thereof is an output are connected in series; and
a second emitter output stage including a bipolar transistor and a bias current source connected to its emitter in the later stage of said second collector output stage in which M (M is an integer) circuits in which the base of said bipolar transistor is an input and the emitter thereof is an output are connected in series,
wherein an output voltage of the reference voltage generator outputting a voltage having constant temperature dependence to temperature is inputted to the base of a bipolar transistor in a first stage of said first collector output stage,
wherein the number of stages N and the number of stages M of said first and second emitter output stages are set so that an output voltage of said temperature coefficient converter has predetermined temperature dependence,
wherein an emitter output in the last stage of said second emitter output stage is connected to the control terminal of said first current source circuit.

6. The frequency generator according to claim 5, wherein a bias current density of said first emitter output stage and a bias current density of said second emitter output stage are set so that an output voltage of said temperature coefficient converter has predetermined temperature dependence.

7. The frequency generator according to claim 5,
wherein the number of stages N of said first emitter output stages is two,
wherein the number of stages M of said second emitter output stages is three.

8. The frequency generator according to claim 5,
wherein the number of stages N of said first emitter output stages is three,
wherein the number of stages M of said second emitter output stages is three,
wherein the collector of the transistor of said second collector output stage is further connected to a diode, and the cathode of said diode is connected to the base of the transistor in the next emitter output stage.

9. The frequency generator according to claim 2, wherein said buffer circuit is a source follower circuit, wherein said first current source circuit is a bias current source provided on the source side of said source follower circuit.

10. The frequency generator according to claim 9, wherein said temperature coefficient converter comprises first and second NMOS transistors, first and second PMOS transistors, and second, third, fourth and fifth current source circuits,
wherein the drain of said first NMOS transistor is connected to a first source voltage, and the source is connected to the gate of said first PMOS transistor and is connected via said second current source circuit to a second source voltage,
wherein the output of said third current source circuit connected to said first source voltage is connected to the gate of said second NMOS transistor and is connected via the source-drain path of said first PMOS transistor to the second source voltage,
wherein the drain of said second NMOS transistor is connected to said first source voltage, and the source is connected to the gate of said second PMOS transistor and is connected via the fourth current source circuit to said second source voltage,
wherein the output of said fifth current source circuit connected to said first source voltage is connected via the source path of said second PMOS transistor to said second source voltage,
wherein an output voltage of said reference voltage generator is inputted to the gate of said first NMOS transistor,
wherein the source of said second PMOS transistor is connected to the control terminal of said first current source circuit.

11. The frequency generator according to claim 10, further comprising:
said second and fourth current source circuits having third and fourth NMOS transistors whose gates are shareably connected;
said third and fifth current source circuits having third and fourth PMOS transistors whose gates are shareably connected;
a fifth diode-connected PMOS transistor in which the source is connected to a first source voltage, and the gate is connected to the drain and is connected to the gates of said third and fourth PMOS transistors;
a fifth NMOS transistor in which the source is connected to a second source voltage, and the gate is connected to the gates of said third and fourth NMOS transistors;
a sixth diode-connected NMOS transistor in which the source is connected to a second source voltage, and the gate is connected to the drain and is connected to the gate of said fifth NMOS transistor; and
a stabilizing power source circuit,
wherein the drain of said fifth NMOS transistor is connected via a fourth resistance to the drain of said fifth PMOS transistor,
wherein said stabilizing power source circuit comprises an operation amplifier in which a bandgap reference voltage is inputted to a non-inverted input terminal and fifth and sixth resistances for dividing an output voltage of said operation amplifier to input it to an inverted terminal,
wherein an output of said stabilizing power source circuit is supplied via a seventh resistance to the drain of said sixth NMOS transistor.

12. The frequency generator according to claim 2, wherein said reference voltage generator is a bandgap reference circuit.

13. An optical communication system comprising a multiplexer receiving, as inputs, a plurality of parallel data signals and a clock and multiplexing the parallel data signals into a serial data signal, a driver amplifying said serial data signal, a laser oscillator generating an optical signal, a modulator outputting an optical modulation signal obtained by modulating said optical signal according to a modulation signal as an output of said driver, an optical fiber transmitting said optical modulation signal, a photo detector converting said optical modulation signal received via said optical fiber to a current signal, an amplifier converting said current signal to a voltage signal, and a demultiplexer demultiplexing a serial data signal into parallel data signals,
wherein said multiplexer includes a mutiplexer-core multiplexing input data signals, a clock-frequency control circuit, and a frequency generator providing a reference clock of the multiplexer, and said demultiplexer includes a demultiplexer-core demultiplexing an input data signal, a clock sampling circuit, and a frequency generator providing a reference clock of the demultiplexer-core,
wherein at least one of a frequency generator in said multiplexer and a frequency generator in said demultiplexer includes the frequency generator according to claim 2.

14. A wireless communication system which is a wireless receiver system comprising an antenna receiving a wireless signal, a first low noise amplifier amplifying an output of said antenna, a frequency generator controlled by a baseband circuit and generating two signals having different $\pi/2$ [radian/second] phases, a first mixer frequency mixing said first low noise amplifier and an output of a first phase of said frequency generator, a first band-pass filter selecting an output of said first mixer by limiting a frequency band, a first IF amplifier amplifying an output of said first band-pass filter, a second mixer frequency mixing said first low noise amplifier and an output of a second phase of said frequency generator, a second band-pass filter selecting an output of said second mixer by limiting a frequency band, a first IF amplifier amplifying an output of said second band-pass filter, and a demodulator demodulating outputs of said first and second IF amplifiers as input signals and fetching a modulation signal to give it to a baseband circuit, wherein said frequency generator includes the frequency generator according to claim 2.

* * * * *